(12) United States Patent
Zhang et al.

(10) Patent No.: US 11,978,796 B2
(45) Date of Patent: May 7, 2024

(54) CONTACT AND ISOLATION IN MONOLITHICALLY STACKED VTFET

(71) Applicant: International Business Machines Corporation, Armonk, NY (US)

(72) Inventors: Chen Zhang, Guilderland, NY (US); Ruilong Xie, Niskayuna, NY (US); Lan Yu, Voorheesville, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 17/545,074

(22) Filed: Dec. 8, 2021

(65) Prior Publication Data
US 2023/0178651 A1 Jun. 8, 2023

(51) Int. Cl.
| H01L 29/78 | (2006.01) |
|---|---|
| H01L 27/088 | (2006.01) |
| H01L 29/417 | (2006.01) |
| H01L 29/66 | (2006.01) |

(52) U.S. Cl.
CPC ........ *H01L 29/7827* (2013.01); *H01L 27/088* (2013.01); *H01L 29/41741* (2013.01); *H01L 29/66666* (2013.01)

(58) Field of Classification Search
CPC .............. H01L 29/7827; H01L 27/088; H01L 29/41741; H01L 29/66666; H01L 29/78642; H01L 21/823487; H01L 21/823885; H01L 27/0688; H01L 21/823475; H01L 21/823814; H01L 21/8221; H01L 21/823871; H01L 27/092

USPC ......................................................... 257/329
See application file for complete search history.

(56) References Cited

U.S. PATENT DOCUMENTS

| 7,683,428 | B2 | 3/2010 | Chidambarrao et al. |
|---|---|---|---|
| 9,177,890 | B2 | 11/2015 | Du |
| 9,659,963 | B2 | 5/2017 | Cheng et al. |
| 9,773,913 | B1 | 9/2017 | Balakrishnan et al. |
| 9,997,413 | B1 | 6/2018 | Leobandung |
| 10,141,448 | B1 * | 11/2018 | Miao ............... H01L 21/823864 |
| 10,192,867 | B1 | 1/2019 | Frougier et al. |

(Continued)

FOREIGN PATENT DOCUMENTS

CN 111952370 A 11/2020

OTHER PUBLICATIONS

International Search Report and Written Opinion for PCT/CN2022/120846 dated Dec. 27, 2022 (9 pages).

*Primary Examiner* — Mohammad M Hoque
(74) *Attorney, Agent, or Firm* — Edward J. Wixted, III

(57) ABSTRACT

Monolithically stacked VTFET devices having source/drain contacts with increased contact area and dielectric isolation are provided. In one aspect, a stacked VTFET device includes: at least a bottom VTFET below a top VTFET, wherein the bottom VTFET and the top VTFET each includes source/drain regions interconnected by a vertical fin channel, and a gate stack alongside the vertical fin channel; and source/drain contacts to the source/drain regions, wherein at least one of the source/drain contacts is in direct contact with more than one surface of a given one of the source/drain regions. A stacked VTFET device having at least a bottom VTFET1 below a top VTFET1, and a bottom VTFET2 below a top VTFET2, and a method of forming a stacked VTFET device are also provided.

20 Claims, 27 Drawing Sheets

(56) References Cited

U.S. PATENT DOCUMENTS

| | | |
|---|---|---|
| 10,217,674 B1 | 2/2019 | Hook et al. |
| 10,276,453 B1 | 4/2019 | Wu |
| 10,297,513 B1 | 5/2019 | Yamashita et al. |
| 10,381,346 B1 | 8/2019 | Zhang et al. |
| 10,833,069 B2 | 11/2020 | Zhang et al. |
| 11,038,018 B2 | 6/2021 | Jeong et al. |
| 2016/0043074 A1 | 2/2016 | Hurley et al. |
| 2018/0277442 A1* | 9/2018 | Leobandung ..... H01L 29/66666 |
| 2019/0229117 A1 | 7/2019 | Zhang et al. |
| 2020/0303263 A1* | 9/2020 | Zhang ............. H01L 21/823487 |
| 2020/0303543 A1* | 9/2020 | Cheng ............... H01L 21/76834 |

* cited by examiner

CONTACT AND ISOLATION IN MONOLITHICALLY STACKED VTFET

FIELD OF THE INVENTION

The present invention relates to monolithically stacked vertical transport field-effect transistor (VTFET) devices, and more particularly, to monolithically stacked VTFET devices having source/drain contacts with increased contact area and dielectric isolation, and techniques for fabrication thereof.

BACKGROUND OF THE INVENTION

As opposed to planar complementary metal-oxide-semiconductor (CMOS) devices, vertical transport field effect transistor (VTFET) devices are oriented with vertical fin channels disposed on a bottom source/drain and a top source/drain disposed on the vertical fin channels. VTFET devices are being pursued as a viable device option for continued CMOS scaling.

Monolithically stacking VTFET devices is one technology option for extending device density beyond standard VTFET device designs. With a monolithically stacked VTFET device architecture, one VTFET device is placed directly on top of another, complementary VTFET device. For instance, in a monolithically stacked VTFET device architecture, a p-channel FET (PFET) VTFET device can be stacked on top of an n-channel FET (NFET) VTFET device, or vice versa.

However, stacking VTFET devices in this manner can present some notable challenges. For instance, when one VTFET device is sitting directly on top of another VTFET device, some of the source/drain regions are buried, and thus are not accessible from the top-down. Having buried source/drain regions makes forming source/drain contacts with a sufficient amount of contact area difficult. A smaller contact area can lead to increased contact resistance and thus decreased device performance.

Therefore, monolithically stacked VTFET device designs having increased contact area would be desirable.

SUMMARY OF THE INVENTION

The present invention provides monolithically stacked vertical transport field-effect transistor (VTFET) devices having source/drain contacts with increased contact area and dielectric isolation. In one aspect of the invention, a stacked VTFET device is provided. The VTFET device includes: at least a bottom VTFET below a top VTFET, wherein the bottom VTFET and the top VTFET each includes source/drain regions interconnected by a vertical fin channel, and a gate stack alongside the vertical fin channel; and source/drain contacts to the source/drain regions, wherein at least one of the source/drain contacts is in direct contact with more than one surface of a given one of the source/drain regions.

In another aspect of the invention, another stacked VTFET device is provided. The VTFET device includes: at least a first bottom VTFET (bottom VTFET1) below a first top VTFET (top VTFET1), and a second bottom VTFET (bottom VTFET2) below a second top VTFET (top VTFET2), wherein the bottom VTFET1, the top VTFET1, the bottom VTFET2 and the top VTFET2 each includes source/drain regions interconnected by a vertical fin channel, and a gate stack alongside the vertical fin channel; a first source/drain contact that is in direct contact with more than one surface of a given one of the source/drain regions in the bottom VTFET1; and a second source/drain contact that is in direct contact with more than one surface of a given one of the source/drain regions in the top VTFET1.

In yet another aspect of the invention, a method of forming a stacked VTFET device is provided. The method includes: forming a stack of alternating first sacrificial layers and active layers on a substrate; patterning at least one fin in the stack; selectively removing patterned portions of the first sacrificial layers from the at least one fin to form gaps above and below patterned portions of the active layers in the at least one fin; forming isolation structures in the gaps between the patterned portions of the active layers in the at least one fin, wherein the isolation structures comprise an isolation layer in between upper and lower second sacrificial layers, and wherein the patterned portions of the active layers in the at least one fin serve as vertical fin channels of at least a bottom VTFET and a top VTFET; forming gate stacks alongside the vertical fin channels; forming source/drain regions in the at least one fin adjacent to the isolation structures; and removing and replacing at least one of the upper and lower second sacrificial layers with at least one source/drain contact that is in direct contact with more than one surface of a given one of the source/drain regions.

A more complete understanding of the present invention, as well as further features and advantages of the present invention, will be obtained by reference to the following detailed description and drawings.

DETAILED DESCRIPTION OF PREFERRED EMBODIMENTS

With a monolithically stacked vertical transport field-effect transistor (VTFET) device architecture, one VTFET device is placed directly on top of another, complementary VTFET device. For instance, a p-channel FET (PFET) VTFET device can be stacked on top of an n-channel FET (NFET) VTFET device, or vice versa. Doing so advantageously increases the density for a given device area.

However, as provided above, a monolithically stacked VTFET device design buries some of the source/drain regions, making them inaccessible from the top of the stacked device. With conventional approaches, this configuration can undesirably lead to a decreased amount of contact area between the source/drain contacts and these buried source/drain regions.

Advantageously, the present techniques leverage a novel structure that includes an isolation layer sandwiched between two sacrificial layers to produce source/drain contacts that directly contact more than one surface of the source/drain regions. Namely, the present source/drain contacts directly contact a surface of the (vertical) sidewall of the source/drain regions, and wrap-around a corner of the source/drain regions to also directly contact an adjacent horizontal surface of the source/drain regions. The present 'wrap-around' source/drain contacts vastly increase the contact area as compared to conventional designs, thereby improving the overall resistance performance of the present stacked VTFET devices.

Figure 1:
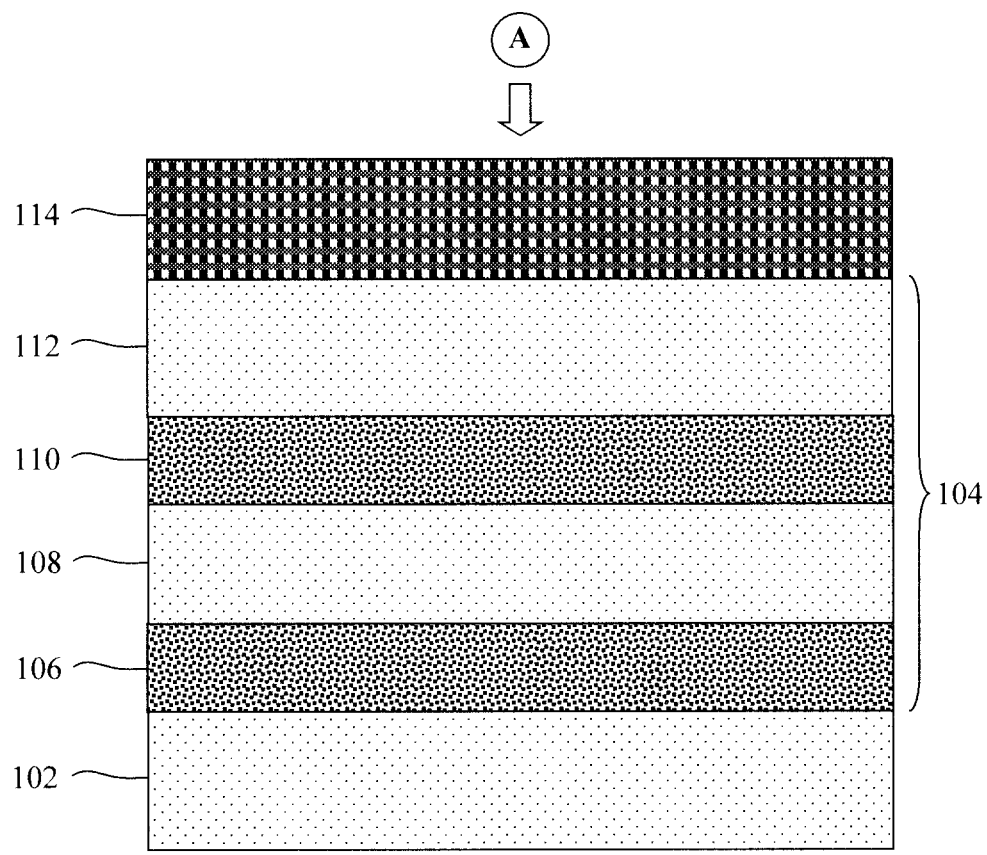
FIG. 1 is a cross-sectional diagram illustrating a stack of alternating (first) sacrificial layers and active layers having been formed onto a substrate, and a hardmask layer having been deposited onto the on the stack according to an embodiment of the present invention.

An exemplary methodology for forming a monolithically stack VTFET device in accordance with the present techniques is now described by way of reference to FIGS. 1-33. As shown in FIG. 1 (a cross-sectional view), the process begins with the formation of a stack 104 of alternating (first) sacrificial layers 106/110 and active layers 108/112 on a substrate 102, and the deposition of a hardmask layer 114 on the stack 104.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 102 may already have pre-built structures (not shown) such as transistors, diodes, capacitors, resistors, interconnects, wiring, etc.

The term 'sacrificial' as used herein refers to a structure that is removed, in whole or in part, during fabrication of the stacked VTFET device. By contrast, active layers 108 and 112 will remain in place and serve as the vertical channels of the VTFET device. According to an exemplary embodiment, each of the sacrificial layers 106/110 and active layers 108/112 are formed on the substrate 102 using an epitaxial growth process. In one exemplary embodiment, each of the sacrificial layers 106 and 110 has a thickness of from about 5 nanometers (nm) to about 10 nm and ranges therebetween, and each of the active layers 108 and 112 has a thickness of from about 10 nm to about 30 nm and ranges therebetween.

The selection of the materials employed for the sacrificial layers 106 and 110 and active layers 108 and 112 is made such that the sacrificial layers 106 and 110 can be removed selective to the active layers 108 and 112 during fabrication of the VTFET device. For instance, by way of example only, according to one embodiment, each of the sacrificial layers 106 and 110 is formed from SiGe, while each of the active layers 108 and 112 is formed from Si. In that case, etchants such as wet hot SC1, vapor phase hydrogen chloride (HCl), vapor phase chlorine trifluoride (ClF$_3$) and other reactive clean processes (RCP) which are selective for etching of SiGe versus Si can be employed to selectively remove the sacrificial layers 106 and 110 relative to the active layers 108 and 112.

Suitable materials for the hardmask layer 114 include, but are not limited to, nitride hardmask materials such as silicon nitride (SiN), silicon oxynitride (SiON) and/or silicon carbide nitride (SiCN), and/or oxide hardmask materials such as silicon oxide (SiOx) which can be deposited onto the stack 104 using a process such as chemical vapor deposition (CVD), atomic layer deposition (ALD) or physical vapor deposition (PVD). According to an exemplary embodiment, the hardmask layer 114 is deposited to a thickness of from about 5 nm to about 20 nm and ranges therebetween.

Figure 2A:
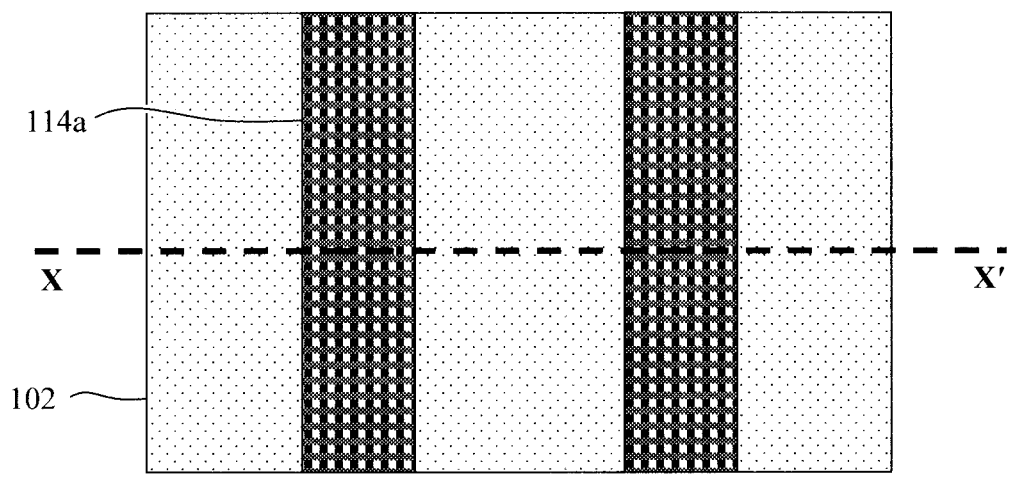
FIG. 2A is a top-down diagram illustrating the hardmask layer having been patterned into individual fin hardmasks which are then used to form at least a (first) fin and a (second) fin in the stack and substrate.
Figure 2B:
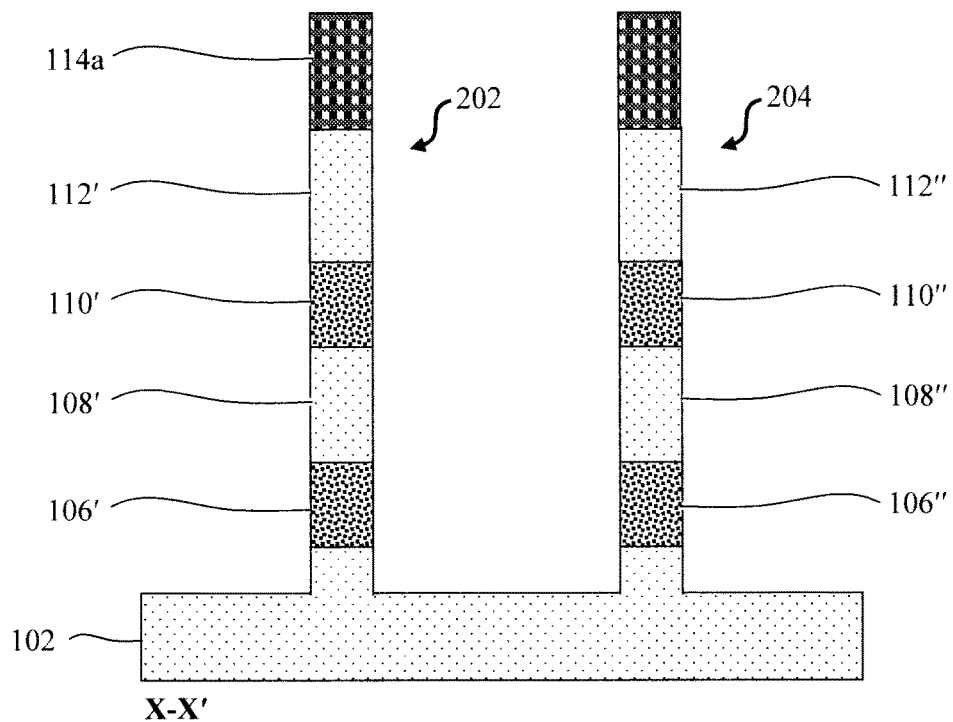
FIG. 2B is an X-X' cross-sectional view illustrating the hardmask layer having been patterned into the individual fin hardmasks which are then used to form at least the first fin and the second fin in the stack and substrate according to an embodiment of the present invention.
Figure 3:
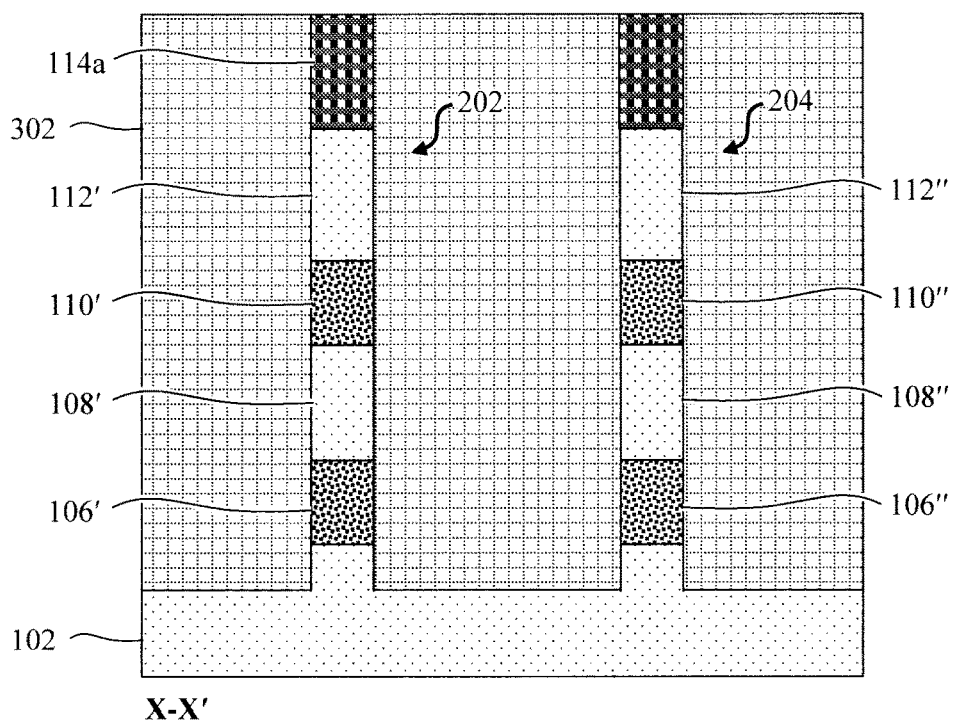
FIG. 3 is an X-X' cross-sectional view illustrating an anchor material having been deposited onto the substrate over, and burying, the first/second fins according to an embodiment of the present invention.
Figure 4:
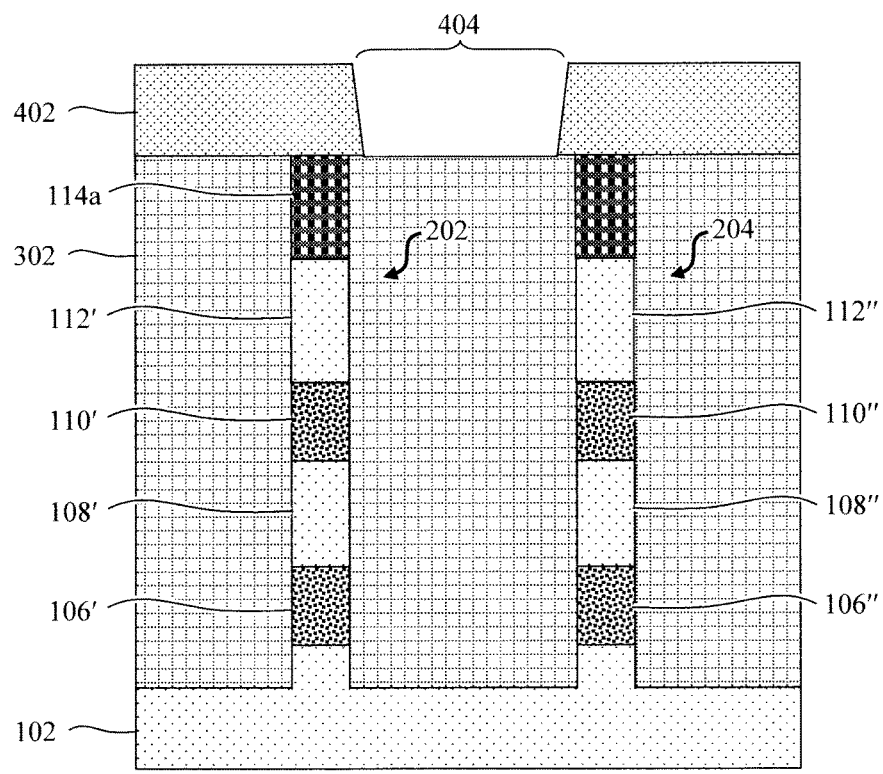
FIG. 4 is an X-X' cross-sectional view illustrating a block mask having been formed on the anchor material over the first/second fins, and the block mask having been patterned with an opening in between the first/second fins according to an embodiment of the present invention.
Figure 5:
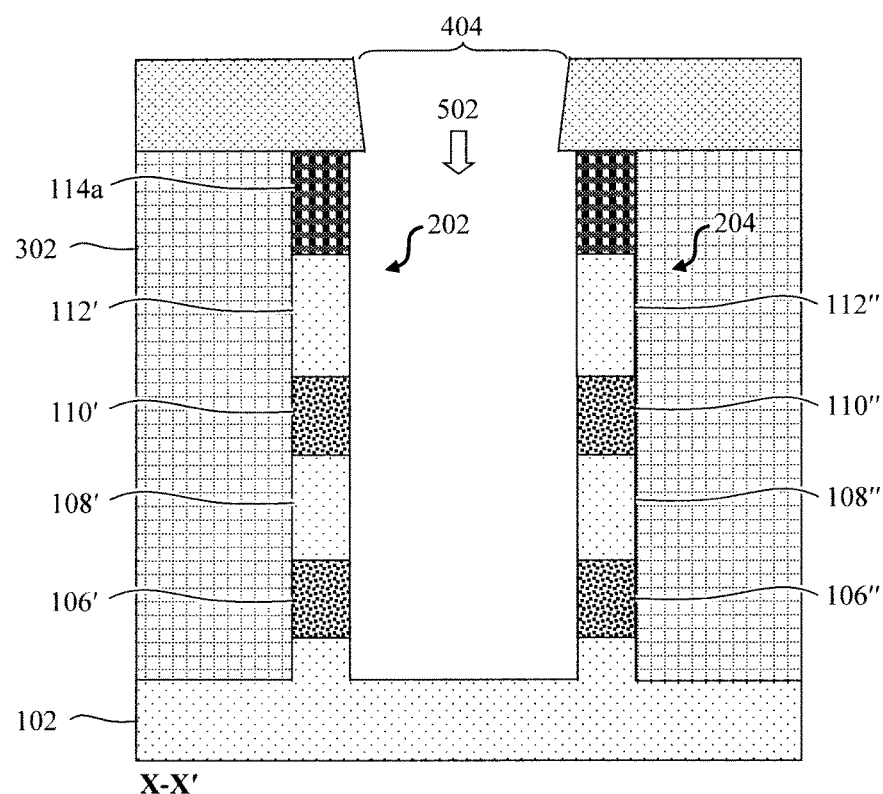
FIG. 5 is an X-X' cross-sectional view illustrating the anchor material having been removed from between the first/second fins via the opening in the block mask, forming a trench in between the first/second fins according to an embodiment of the present invention.

The hardmask layer 114 is then patterned into individual fin hardmasks 114a which are used to form at least a (first) fin 202 and a (second) fin 204 in the stack 104 and substrate 102. See FIG. 2A (a top-down view from viewpoint A—see FIG. 1) and FIG. 2B (an X-X' cross-sectional view). As shown in FIG. 2A, following patterning of the fins 202 and 204, the underlying substrate 102 is now visible from a top-down viewpoint. FIG. 2A also illustrates the orientation of the X-X' cross-sectional views that will be depicted in the following figures. Namely, the X-X' cross-sectional views will depict cuts through the fins 202 and 204 along line X-X' which is perpendicular to the fins 202 and 204. As shown in FIG. 2B, the fin hardmasks 114a mark the footprint and location of each of the fins 202 and 204, which extend through the stack 104 and partway into the substrate 102. The patterned portions of the sacrificial layers 106/110 and active layers 108/112 in the fins 202 and 204 are now given the reference numerals 106'/106" and 110'/110" and 108'/108" and 112'/112", respectively.

Standard lithography and etching techniques can be employed to pattern the hardmask layer 114 into the fin hardmasks 114a. For instance, with standard lithography and etching techniques, a lithographic stack (not shown), e.g., photoresist/organic planarizing layer (OPL)/anti-reflective coating (ARC), is used to pattern fin hardmasks 114a with the footprint and location of the fins 202 and 204. Alternatively, the fin hardmasks 114a can be formed by other suitable techniques, including but not limited to, sidewall image transfer (SIT), self-aligned double patterning (SADP), self-aligned quadruple patterning (SAQP), and other self-aligned multiple patterning (SAMP). A directional (i.e., anisotropic) etching process such as reactive ion etching (RIE) can then be employed to transfer the pattern from the fin hardmasks 114a to the underlying stack 104/substrate 102 forming the fins 202 and 204 shown in FIG. 2B.

An anchor material 302 is then deposited onto the substrate 102 over, and burying, the fins 202 and 204. See FIG. 3 (an X-X' cross-sectional view). As will be described in detail below, this anchor material 302 will serve to anchor the fins 202 and 204 (i.e., hold the fins 202 and 204 in place) while the patterned portions 1067106" and 110'/110" of the sacrificial layers are selectively removed from the fins 202 and 204. Suitable anchor materials include, but are not limited to, SiOx and/or SiON which can be deposited using a process such as CVD, ALD or PVD. Following deposition, the anchor material 302 can be polished down to the tops of the fin hardmasks 114a using a process such as chemical-mechanical polishing (CMP).

A block mask 402 is then formed on the anchor material 302 over the fins 202 and 204, and is patterned with an opening 404 in between the fins 202 and 204. See FIG. 4 (an X-X' cross-sectional view). Suitable block mask materials include, but are not limited to, organic planarizing layer (OPL) materials, which can be deposited onto the anchor material 302 using a casting process such as spin casting or spray casting. Standard lithography and etching techniques (see above) can be employed to pattern the opening 404 in block mask 402. As will be described in detail below, the block mask 402 will be used to selectively remove the anchor material 302 in between the fins 202 and 204. Thus, the exact dimensions of the opening 404 in block mask 402 are not critical as long as the opening 404 exposes at least a portion of the anchor material 302 in between the fins 202 and 204, and fully covers the anchor material 302 shown to the left and to the right of the fins 202 and 204, respectively. Thus, the opening 404 may even extend slightly over one or more of the fin hardmasks 114a (not shown).

The anchor material 302 is removed from between the fins 202 and 204 via the opening 404 in block mask 402, forming a trench 502 in between the fins 202 and 204. See FIG. 5 (an X-X' cross-sectional view). As provided above, the anchor material 302 can be an oxide material such as SiOx. In that case, an oxide-selective non-directional (i.e., isotropic) etching process such as an oxide-selective wet chemical etch or gas phase etch can be employed to remove the anchor material 302 from between the fins 202 and 204. The block mask 402 is then removed. By way of example only, when the block mask 402 is an OPL (see above), it can be removed using an ashing process.

Figure 6:
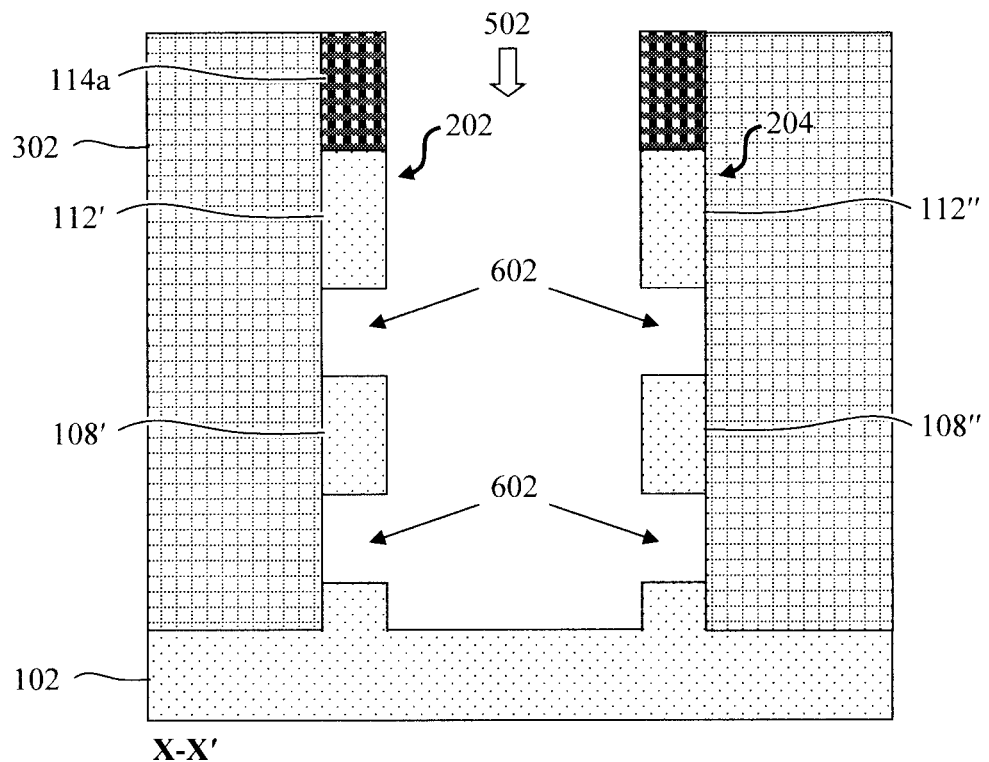
FIG. 6 is an X-X' cross-sectional view illustrating patterned portions of the first sacrificial layers having been selectively removed from the first/second fins, forming gaps above and below patterned portions of the active layers (i.e., the vertical channels of the stacked VTFET device) in the first/second fins according to an embodiment of the present invention.
Figure 7:
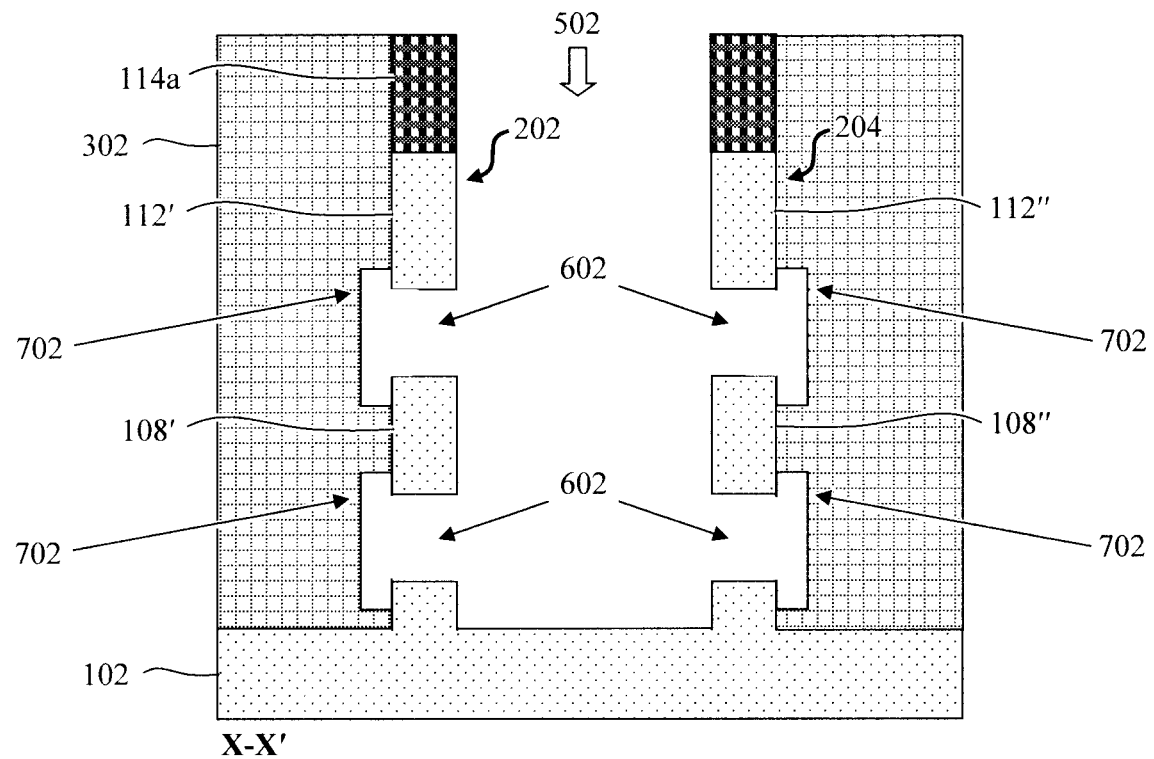
FIG. 7 is an X-X' cross-sectional view illustrating a recess etch of the anchor material having been performed through the gaps, forming voids in the anchor material on a side of the patterned portions of the active layers opposite the trench according to an embodiment of the present invention.
Figure 8:
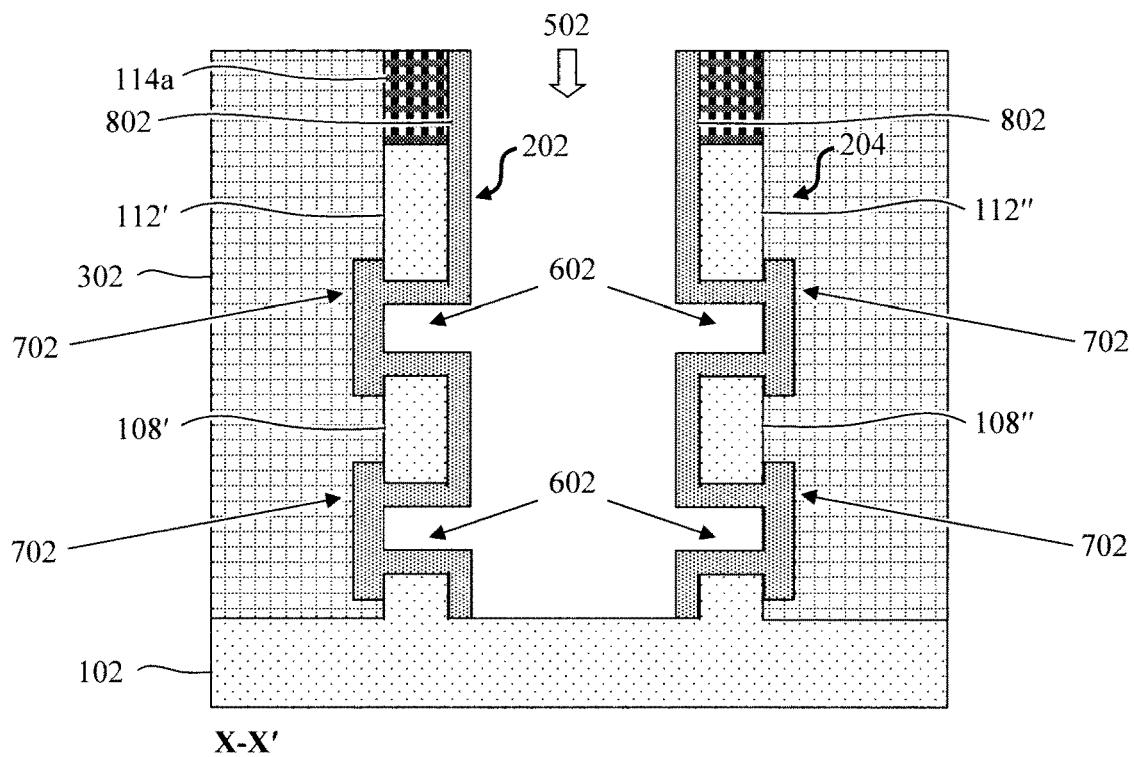
FIG. 8 is an X-X' cross-sectional view illustrating a conformal (second) sacrificial layer having been deposited into, and lining the trench and gaps (and filling the voids) according to an embodiment of the present invention.

Forming the trench 502 in between the fins 202 and 204 provides access to the patterned portions 106'/106" and 110'/110" of the sacrificial layers which are then selectively removed from the fins 202 and 204, forming gaps 602 above and below the patterned portions 108'/108" and 112'/112" of the active layers (i.e., the vertical channels of the stacked VTFET device). See FIG. 6 (an X-X' cross-sectional view). As shown in FIG. 6, the anchor material 302 that remains serves to hold the patterned portions 108'/108" and 112'/112" of the active layers in place during this process. As provided above, the sacrificial layers can be formed from SiGe, while the active layers can be formed from Si. In that case, etchants such as wet hot SC1, vapor phase hydrogen chloride (HCl), vapor phase chlorine trifluoride ($ClF_3$) and other reactive clean processes (RCP) which are selective for etching of SiGe versus Si can be employed to selectively remove the patterned portions 106'/106" and 110'/110" of the sacrificial layers relative to the patterned portions 108'/108" and 112'/112" of the active layers.

A recess etch of the anchor material 302 is next performed through the gaps 602, forming voids 702 in the anchor material 302 on a side of the patterned portions 108'/108" and 112'/112" of the active layers opposite the trench 502. See FIG. 7 (an X-X' cross-sectional view). As provided above, the anchor material 302 can be an oxide material such as SiOx. In that case, an oxide-selective non-directional (i.e., isotropic) etching process such as an oxide-selective wet chemical etch or gas phase etch can be employed. Notably, following formation of the voids, the anchor material 302 still remains in contact with each of the patterned portions 108'/108" and 112'/112" of the active layers, holding them in place. See FIG. 7. As will be described in detail below, forming the voids 702 in the anchor material 302 opposite the trench 502 will enable a (second) sacrificial layer to be deposited into, and lining, the gaps 602 without that sacrificial material fully filling the gaps 602.

Namely, a conformal (second) sacrificial layer 802 is next deposited into, and lining the trench 502 and gaps 602 (and filling the voids 702). See FIG. 8 (an X-X' cross-sectional view). According to an exemplary embodiment, the sacrificial layer 802 is deposited to a thickness of from about 2 nm to about 10 nm and ranges therebetween. Without the voids 702 in place next to the gaps 602 and opposite the trench 502, the sacrificial layer 802 might overfill and pinch off the gaps 602, which is undesirable since an isolation material still needs to be deposited into the gaps 602 (see below).

In general, the material chosen for sacrificial layer 802 needs to have etch selectivity relative to, among other things, the patterned portions 108'/108" and 112'/112" of the active layers and the isolation material that will be deposited into the gaps 602 (see below). According to an exemplary embodiment, the sacrificial layer 802 is formed from high germanium (Ge) content SiGe, which can be conformally deposited into and lining the trench 502 and gaps 602 using a process such as CVD, ALD or PVD. SiGe having a high Ge content can be selectively removed relative to Si, SiN, etc. using an etchant such as dry HCl. In one exemplary embodiment, high Ge content SiGe is SiGe having from about 50% Ge to about 100% Ge (i.e., pure Ge) and ranges therebetween. For instance, in one non-limiting example, sacrificial layer 802 is formed from SiGe65 (which is SiGe having a Ge content of about 65%). By contrast, when the sacrificial layers 106 and 110 are formed from SiGe (see above), a low Ge content SiGe may be employed for the sacrificial layers 106 and 110. In one exemplary embodiment, a low Ge content SiGe is SiGe having from about 20% Ge to about 50% Ge and ranges therebetween. For instance, in one non-limiting example, sacrificial layers 106 and 110 are formed from SiGe30 (which is SiGe having a Ge content of about 30%).

Alternatively, other materials that also provide the required etch selectivity include, but are not limited to, SiOx, aluminum oxide ($Al_2O_3$) and/or silicon oxycarbide (SiCO), which can be conformally deposited into and lining the trench 502 and gaps 602 using a process such as CVD, ALD or PVD.

Figure 9:
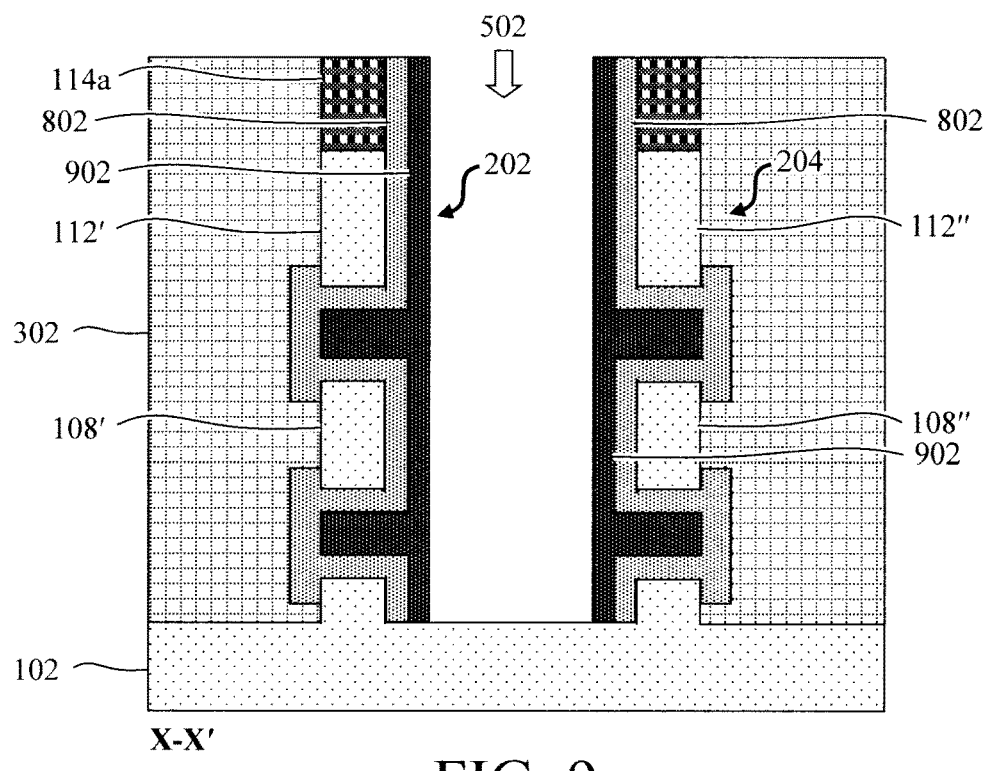
FIG. 9 is an X-X' cross-sectional view illustrating an isolation material having been deposited over the sacrificial layer according to an embodiment of the present invention.
Figure 10:
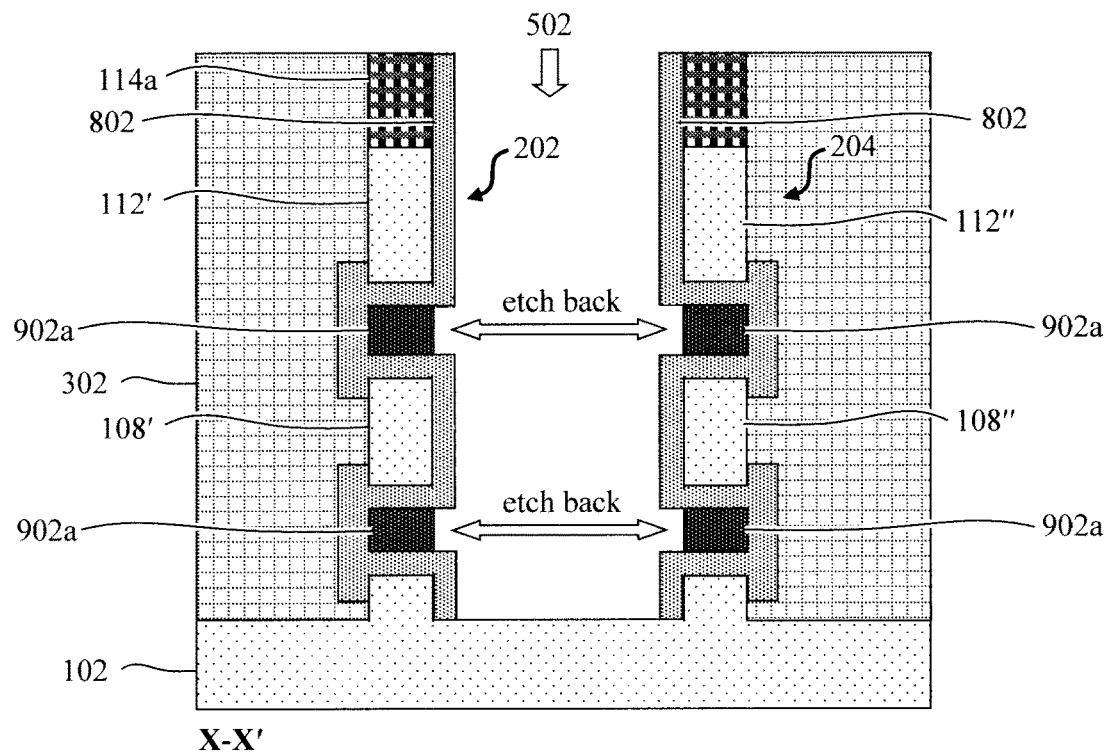
FIG. 10 is an X-X' cross-sectional view illustrating an etch-back of the isolation material having been performed according to an embodiment of the present invention.
Figure 11:
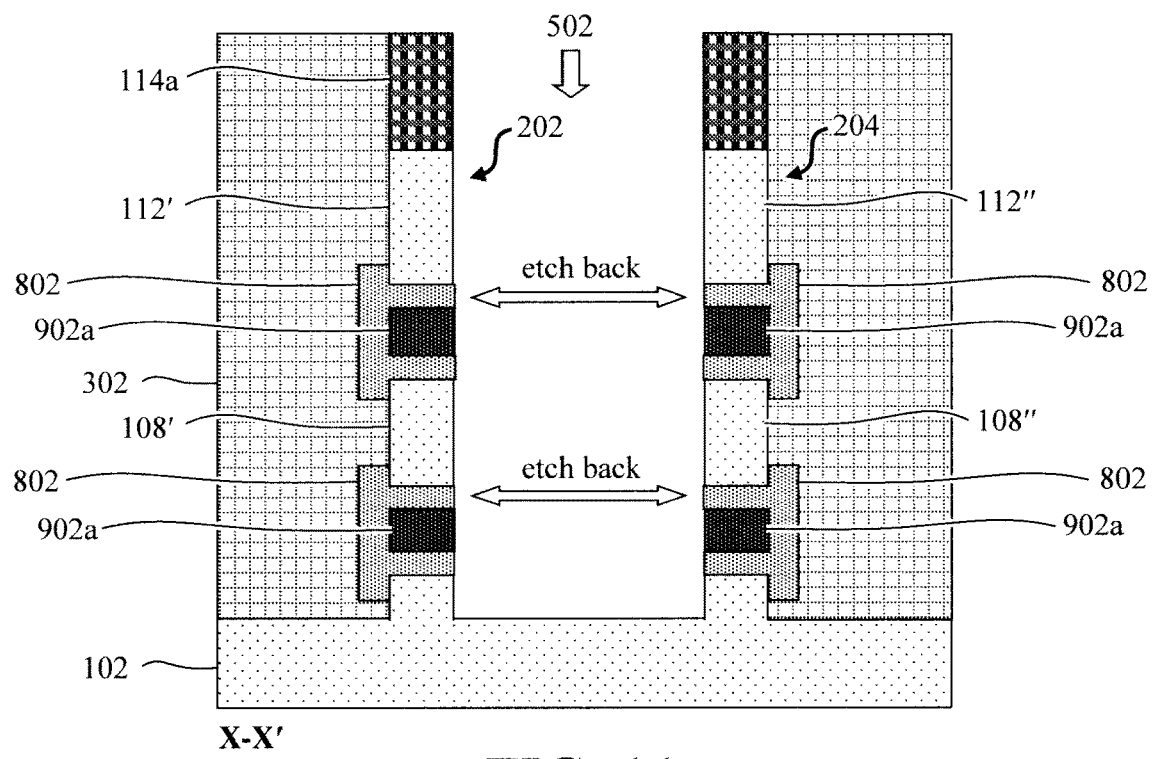
FIG. 11 is an X-X' cross-sectional view illustrating an etch-back of the second sacrificial layer having been performed through the trench according to an embodiment of the present invention.

An isolation material 902 is then deposited over the sacrificial layer 802. See FIG. 9 (an X-X' cross-sectional view). Suitable isolation materials include, but are not limited to, SiN, SiON and/or SiCN, which can be deposited using a process such as CVD, ALD or PVD. According to an exemplary embodiment, the isolation material 902 is deposited a thickness of from about 2 nm to about 10 nm and ranges therebetween. As shown in FIG. 9, the isolation material 902 deposited over the sacrificial layer 802 fully pinches off the gaps 602 meaning that no open gaps 602 remain. This pinching off of the gaps 602 is desirable since doing so creates the above-referenced novel structure that will be used to produce the present 'wrap-around' source/drain contacts.

An etch-back of the isolation material 902 is then performed. See FIG. 10 (an X-X' cross-sectional view). As provided above, the isolation material 902 can be a nitride material such as SiN, SiON and/or SiCN. In that case, a nitride-selective non-directional (i.e., isotropic) etching process such as a nitride-selective wet chemical or gas phase etch can be employed to etch-back the isolation material 902 forming distinct isolation layers 902a above and below the patterned portions 108'/108" and 112'/112" of the active layers, that are separated from the patterned portions 108'/108" and 112'/112" of the active layers by the sacrificial layer 802.

An etch-back of the sacrificial layer 802 is next performed through the trench 502. See FIG. 11 (an X-X' cross-sectional view). As provided above, the sacrificial layer 802 can be formed from SiGe having a high Ge content. In that case, an etchant such as dry HCl can be employed to etch-back the sacrificial layer 802.

Figure 12:
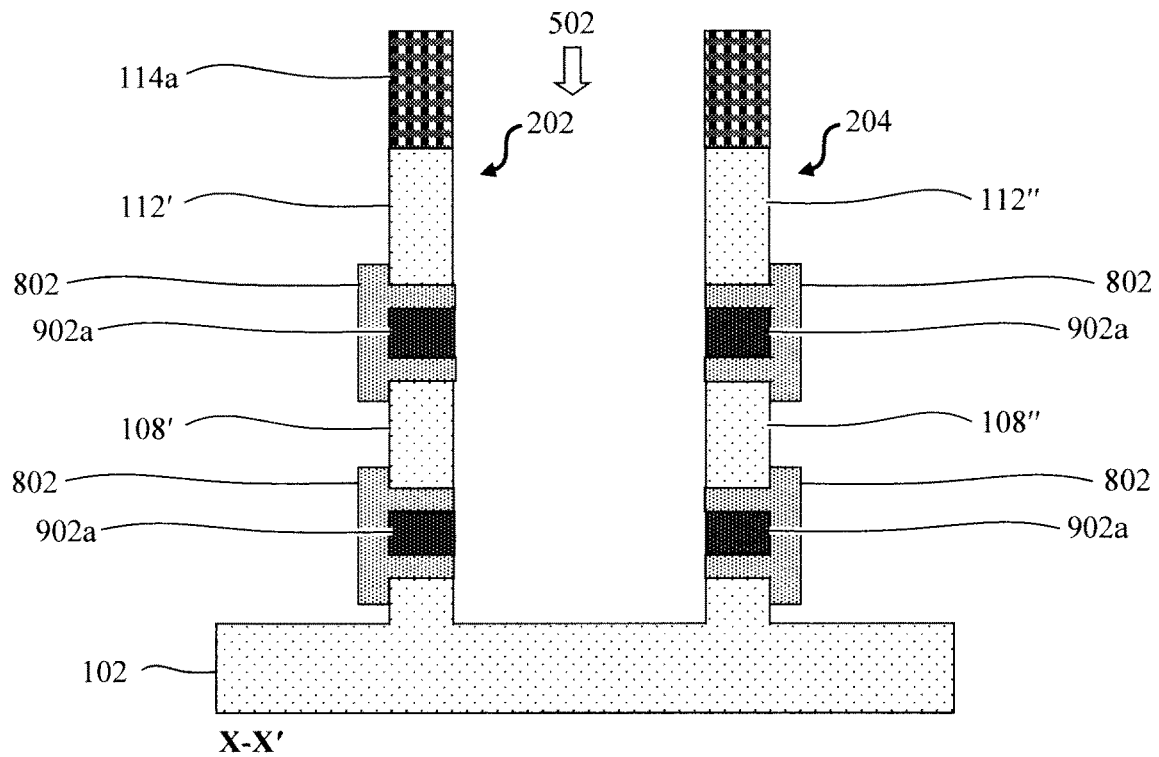
FIG. 12 is an X-X' cross-sectional view illustrating the remaining anchor material having been removed according to an embodiment of the present invention.

Now that the gaps 602 have been filled with the second sacrificial layer 802 and isolation layer 902a, holding the patterned portions 108'/108" and 112'/112" of the active layers in place, what remains of the anchor material 302 is then removed. See FIG. 12 (an X-X' cross-sectional view). As provided above, the anchor material 302 can be an oxide material such as SiOx. In that case, an oxide-selective non-directional (i.e., isotropic) etching process such as an oxide-selective wet chemical etch or gas phase etch can be employed to remove the remaining anchor material 302. As shown in FIG. 12, removal of the remaining anchor material 302 exposes the second sacrificial layer 802 that was deposited into the voids 702 (see above) on a side of the patterned portions 108'/108" and 112'/112" of the active layers and the isolation layer 902a opposite the trench 502.

Figure 13:
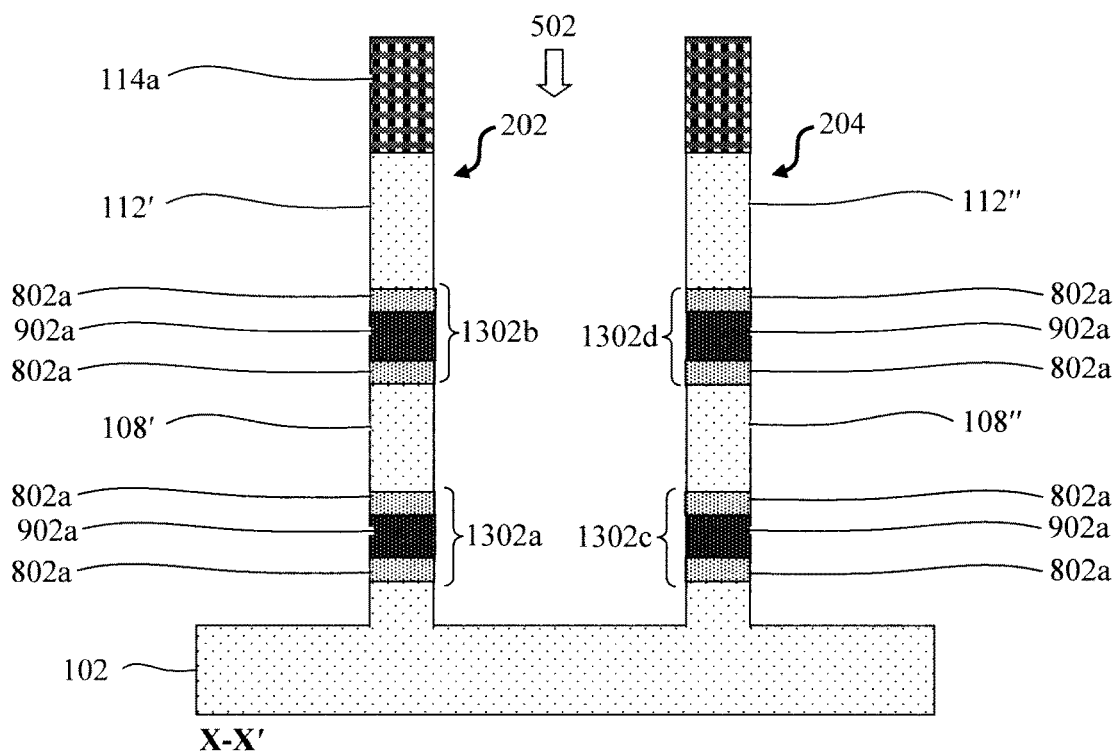
FIG. 13 is an X-X' cross-sectional view illustrating an etch-back of the second sacrificial layer having been performed from a side of the patterned portions of the active layers and the isolation layer opposite the trench forming isolation structures having an isolation layer sandwiched between upper and lower second sacrificial layers according to an embodiment of the present invention.
Figure 14A:
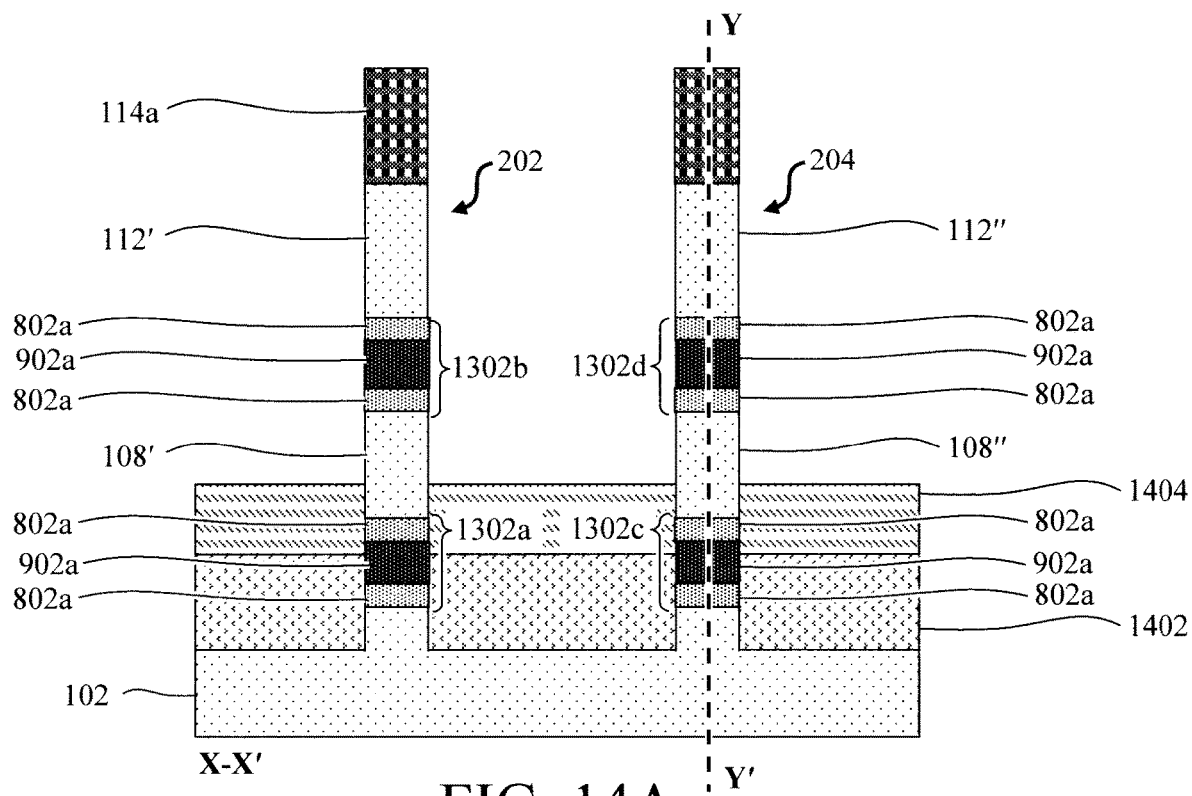
FIG. 14A is an X-X' cross-sectional view illustrating an isolation material having been deposited onto the substrate at the base of the first/second fins, and a (first) doped layer having been deposited onto the isolation material, surrounding the first/second fins.
Figure 14B:
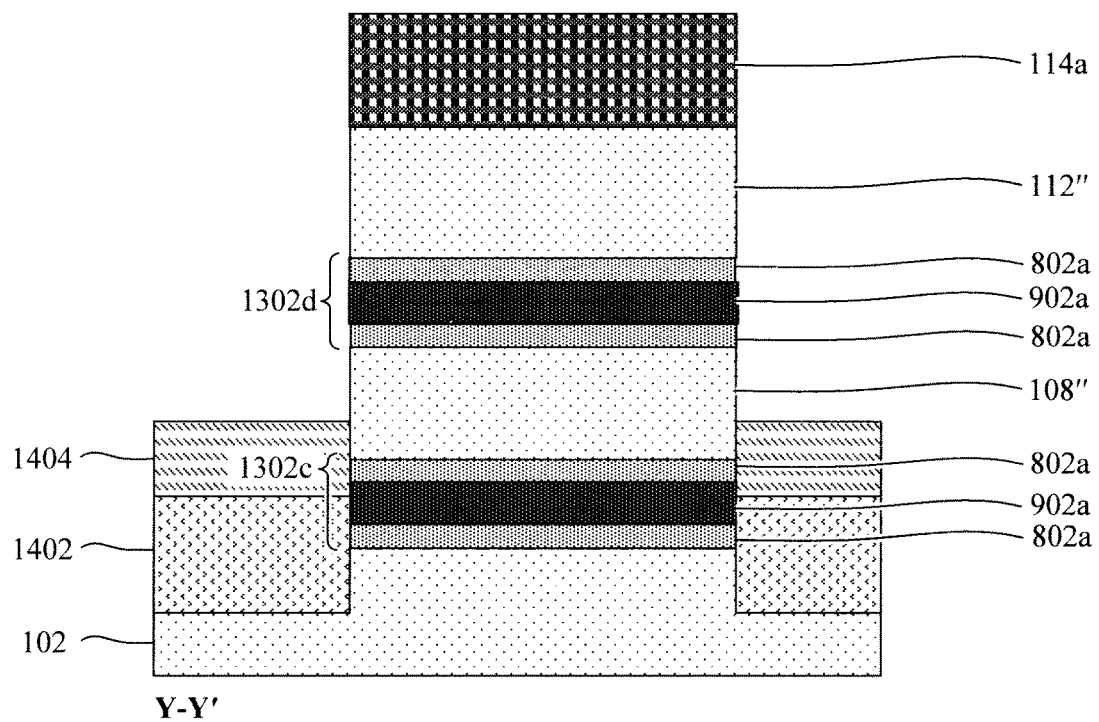
FIG. 14B is a Y-Y' cross-sectional view illustrating an isolation material having been deposited onto the substrate at the base of the first/second fins, and a doped layer having been deposited onto the isolation material, surrounding the first/second fins, according to an embodiment of the present invention.
Figure 15A:
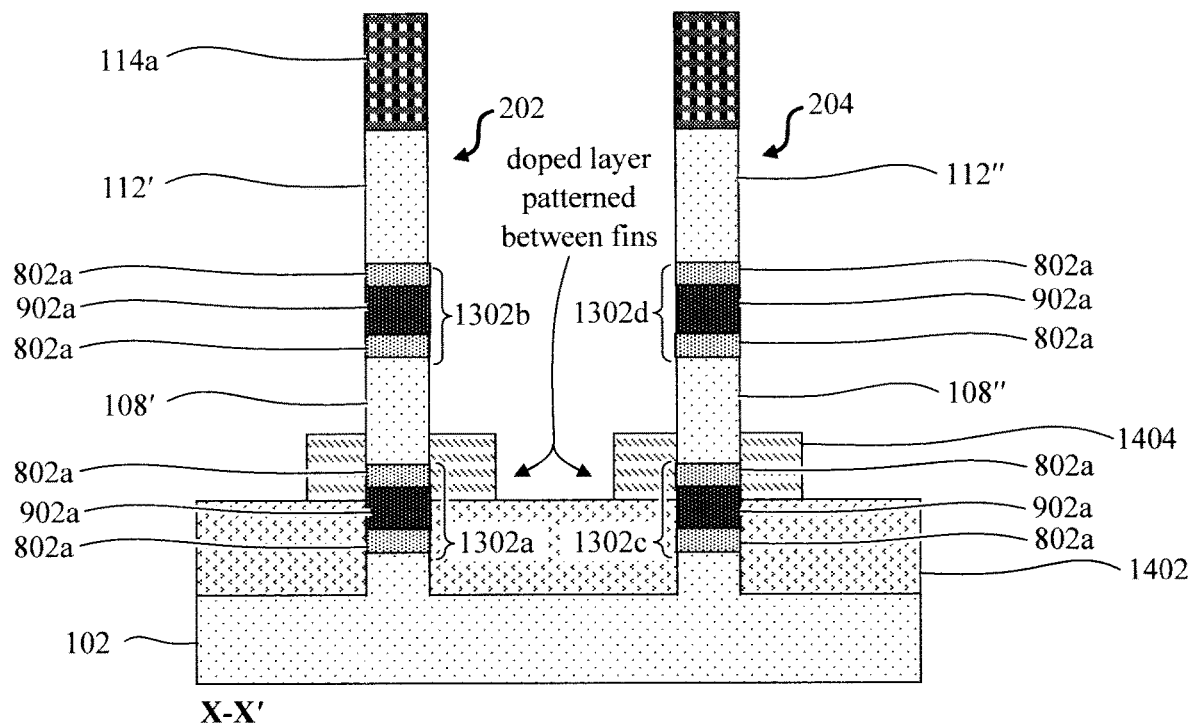
FIG. 15A is an X-X' cross-sectional view illustrating the first doped layer having been patterned.
Figure 15B:
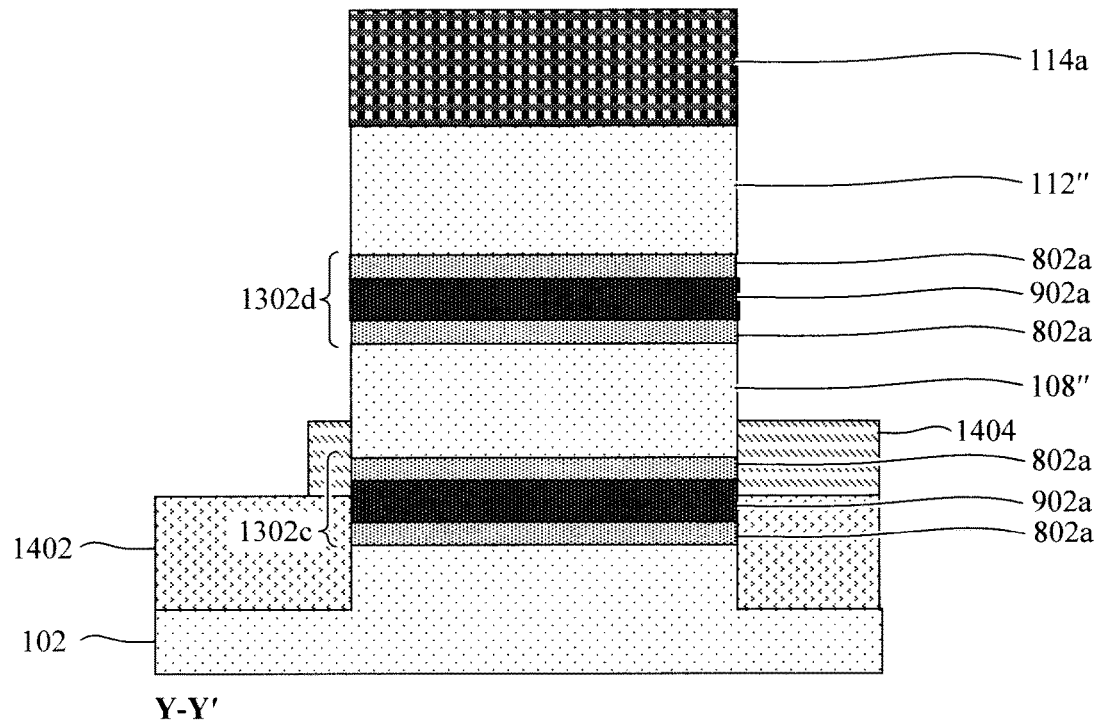
FIG. 15B is a Y-Y' cross-sectional view illustrating the first doped layer having been patterned according to an embodiment of the present invention.
Figure 16A:
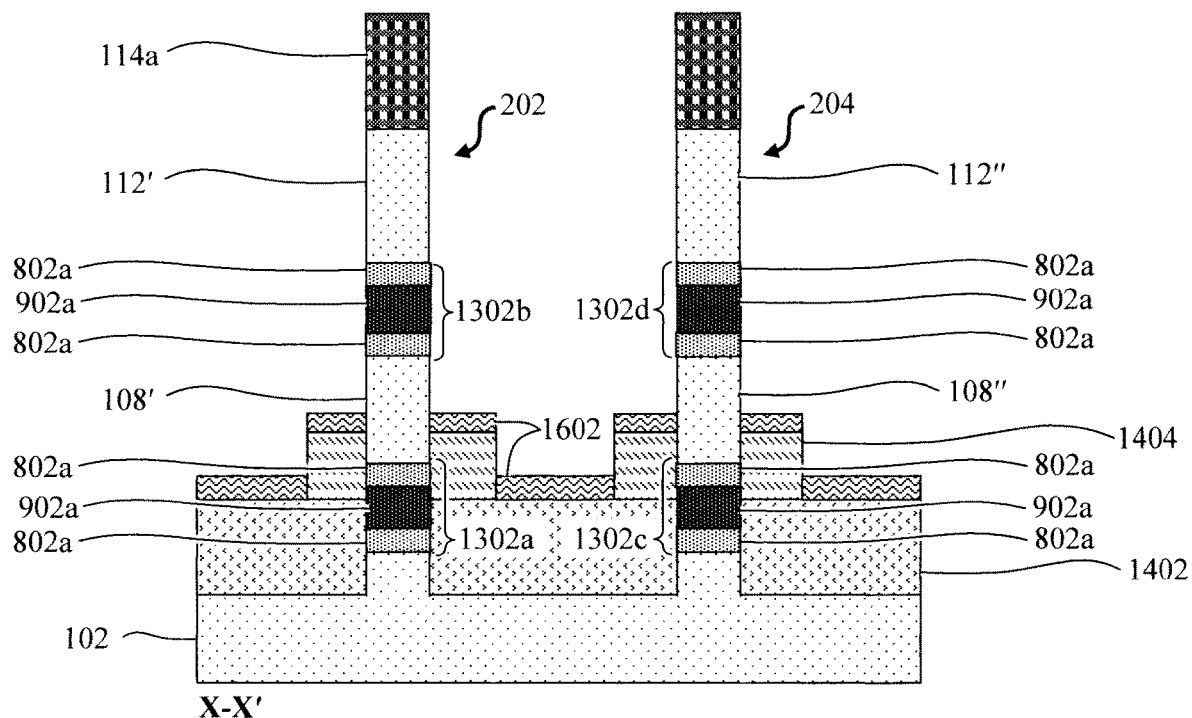
FIG. 16A is an X-X' cross-sectional view illustrating bottom spacers of the bottom VTFETs having been formed on the isolation material and (patterned) first doped layer.
Figure 16B:
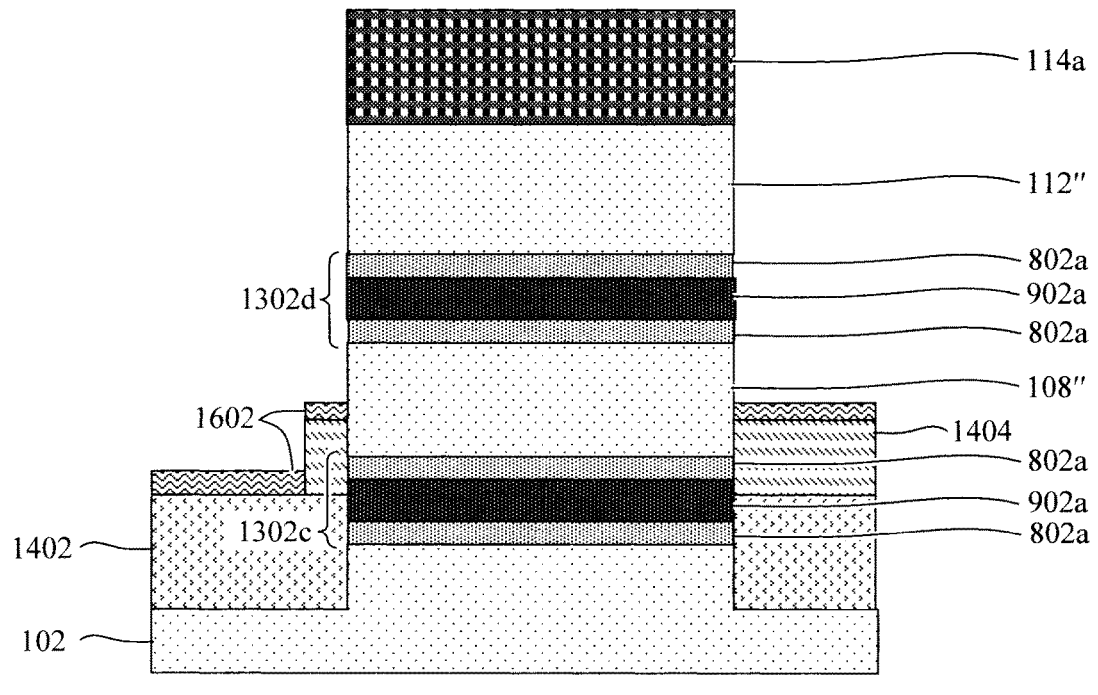
FIG. 16B is a Y-Y' cross-sectional view illustrating the bottom spacers of the bottom VTFETs having been formed on the isolation material and (patterned) first doped layer according to an embodiment of the present invention.

An etch-back of the second sacrificial layer 802 is next performed from a side of the patterned portions 108'/108" and 112'/112" of the active layers and the isolation layer 902a opposite the trench 502 forming distinct second sacrificial layers 802a above and below the isolation layer 902a. See FIG. 13 (an X-X' cross-sectional view). As shown in FIG. 13, the above-referenced isolation structures 1302a,b,c,d have now been created between the patterned portions 108'/108" and 112'/112" of the active layers. Each of the isolation structures 1302a,b,c,d includes the isolation layer 902a sandwiched between the second sacrificial layers 802a. As will be described in detail below, these unique isolation structures 1302a,b,c,d will be used to form source/drain contacts that wrap-around the corner of the source/drain regions from the vertical sidewall to the adjacent horizontal surface for increased contact area.

First however, bottom and top VTFET devices are constructed along the patterned portions 108'/108" and 112'/112" of the active layers. Namely, the patterned portions 108' and 112' of the active layers will serve as the vertical fin channels of a first bottom VTFET (i.e., bottom VTFET1) and a first top VTFET (i.e., top VTFET1), respectively. Likewise, the patterned portions 108" and 112" of the active layers will serve as the vertical fin channels of a second bottom VTFET (i.e., bottom VTFET2) and a second top VTFET (i.e., top VTFET2), respectively. As highlighted above, the present stacked VTFET designs can include a PFET stacked on an NFET, or vice versa. Thus, in accordance with the present techniques, the bottom VTFETs (i.e., bottom VTFET1 and bottom VTFET2) can be either an NFET or a PFET. Likewise, the top VTFETs (i.e., top VTFET1 and top VTFET2) can be either an NFET or a PFET. In the example that follows, the bottom VTFETs (i.e., bottom VTFET1 and bottom VTFET2) are NFETs while the top VTFETs (i.e., top VTFET1 and top VTFET2) are PFETs. However, given the instant description, one skilled in the art would be able to instead form the bottom VTFETs (i.e., bottom VTFET1 and bottom VTFET2) as PFETs and the top VTFETs (i.e., top VTFET1 and top VTFET2) as NFETs.

To fabricate the bottom and top VTFET devices, an isolation material 1402 is first deposited onto the substrate 102 at the base of the fins 202 and 204. See FIG. 14A (an X-X' cross-sectional view) and FIG. 14B (a Y-Y' cross-sectional view). Namely, FIG. 14B and subsequent views along this direction depict a Y-Y' cross-sectional cut through one of the fins (in this case fin 204) as shown illustrated in FIG. 14B. The isolation material 1402 will serve to electrically isolate the stacked (bottom and top) VTFET devices along fin 202 from the stacked (bottom and top) VTFET devices along fin 204. Suitable isolation materials include, but are not limited to, oxide materials such as SiOx, which can be deposited using a process such as CVD, ALD or PVD. Following deposition, the isolation material 1402 is then recessed. According to an exemplary embodiment, a top surface of the recessed isolation material 1402 is below a top surface of the isolation layer 902a in the isolation structures 1302a and 1302c.

A doped layer 1404 is then deposited onto the isolation material 1402, surrounding the fins 202 and 204. The purpose of doped layer 1404 (and of the doped layers similarly employed in subsequent steps) is two-fold. First, as its name implies, the doped layer 1404 serves as a source of dopant for forming the bottom source/drain region of the bottom VTFETs. Second, the doped layer 1404 serves as a sacrificial layer during contact formation that is removed following formation of the bottom source/drain region of the bottom VTFETs and replaced with a contact metal(s). Regarding the first function of the doped layer 1404, i.e., serving as a dopant source for the bottom source/drain region of the bottom VTFETs, the particular dopant employed depends on whether the bottom VFETs are NFETs or PFETs. If the bottom VTFETs are NFETs (as in the instant example), then the bottom source/drain regions include an n-type dopant. On the other hand, if the bottom VTFETs are PFETs, then the bottom source/drain regions include a p-type dopant.

By way of example only, suitable dopant sources include, but are not limited to, phosphorous-doped glass (PSG) as an n-type dopant source and boron-doped glass (BSG) as a p-type dopant source. Thus, in the present example where the bottom VTFETs are NFETs, the doped layer 1404 can be formed from PSG. However, as provided above, the reverse configuration can be employed where the bottom VTFETs are PFETs. In that case, the doped layer 1404 can instead be formed from BSG.

According to an exemplary embodiment, the doped layer 1404 is deposited using a directional deposition process whereby a greater amount of the material, i.e., PSG (or alternatively BSG), is deposited on horizontal surfaces (including on top of the isolation material 1402), as compared to vertical surfaces (such as along sidewalls of the fins 202 and 204). Thus, when an etch is used on the material, i.e., PSG (or alternatively BSG), the timing of the etch needed to remove the material from the vertical surfaces will leave the doped layer 1404 shown in FIG. 14 on the isolation material 1402 since a greater amount of the material was deposited on these (horizontal) surfaces to begin with. By way of example only, a high-density plasma (HDP), chemical vapor deposition (CVD) or physical vapor deposition (PVD) process can be used for directional film deposition, and a non-directional (i.e., isotropic) etch can be used to remove the (thinner) material deposited on the vertical surfaces. According to an exemplary embodiment, the as-formed doped layer 1404 is present alongside the isolation layer 902a in the isolation structures 1302a and 1302c (of fins 202 and 204, respectively), the patterned portions 108'/108" of the active layers and the corresponding second sacrificial layers 802a therebetween. For clarity, the terms 'upper' and 'lower' may also be used herein when referring to the second sacrificial layers 802a above and below the isolation layer 902a in each of the isolation structures 1302a,b,c. To look at it another way, each of the isolation structures 1302a,b,c includes the isolation layer 902a in between 'upper' and 'lower' second sacrificial layers 802a.

The doped layer 1404 is then patterned. See FIG. 15A (an X-X' cross-sectional view) and FIG. 15B (a Y-Y' cross-sectional view). As provided above, one of the functions of doped layer 1404 is doped layer 1404 is to serve as a sacrificial layer during contact formation. Patterning of the doped layer 1404 between the fins 202 and 204 will enable source/drain contacts to be formed to the source/drain regions of the bottom VTFETs independently. Standard lithography and etching techniques (see above) can be employed to pattern the doped layer 1404.

Bottom spacers 1602 of the bottom VTFETs are formed on the isolation material 1402 and (patterned) doped layer 1404. See FIG. 16A (an X-X' cross-sectional view) and FIG. 16B (a Y-Y' cross-sectional view). Suitable materials for the bottom spacers 1602 include, but are not limited to, silicon dioxide ($SiO_2$) and/or silicon oxycarbide (SiOC). In the same manner as described above, the bottom spacers 1602 can be deposited using a directional deposition process, such as HDP, CVD or PVD, with a greater amount of the spacer material being deposited onto horizontal surfaces, followed by an etch to remove the spacer material from vertical surfaces resulting in formation of the bottom spacers 1602 shown in FIGS. 16A and 16B. According to an exemplary embodiment, the bottom spacers 1602 have a thickness of from about 2 nanometers (nm) to about 10 nm and ranges therebetween. In one embodiment, the as-formed bottom spacers 1602 are present alongside the patterned portions 108'/108" of the active layers.

Figure 17A:
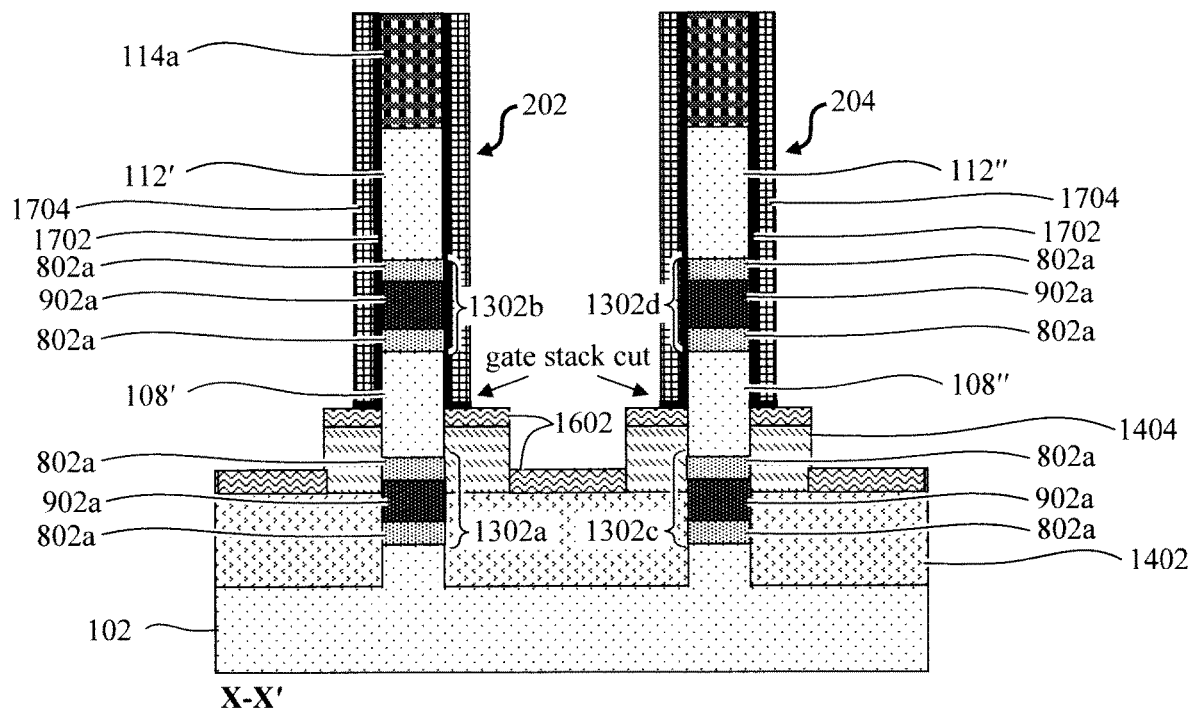
FIG. 17A is an X-X' cross-sectional view illustrating gate stacks (i.e., a gate dielectric and a gate conductor) of the bottom VFETs having been formed alongside the first/second fins above the bottom spacers, and cut.
Figure 17B:
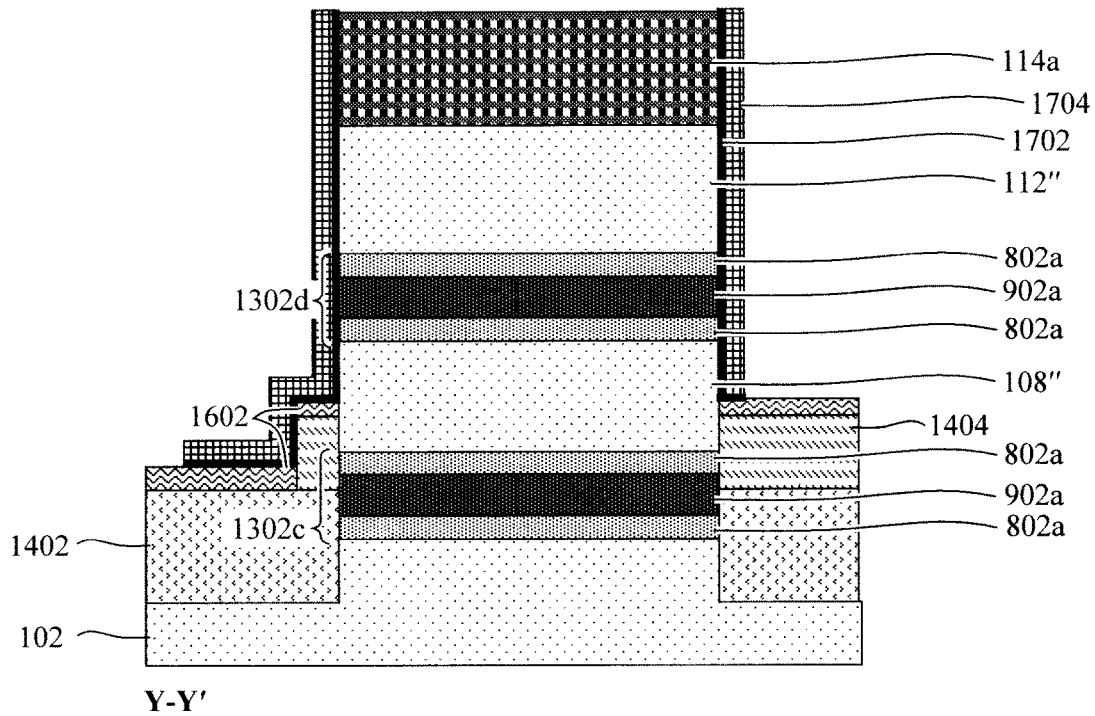
FIG. 17B is a Y-Y' cross-sectional view illustrating the gate stacks (i.e., a gate dielectric and a gate conductor) of the bottom VFETs having been formed alongside the first/second fins above the bottom spacers, and cut according to an embodiment of the present invention.

Gate stacks of the bottom VFETs are next formed alongside the fins 202 and 204 above the bottom spacers 1602. See FIG. 17A (an X-X' cross-sectional view) and FIG. 17B (a Y-Y' cross-sectional view). As shown in FIGS. 17A and 17B, each gate stack includes a gate dielectric 1702 and a gate conductor 1704. According to an exemplary embodiment, conformal layers of the gate dielectric 1702 and a gate conductor 1704 are deposited over the fins 202 and 204. Standard lithography and etching techniques (see above) are then employed to cut the gate stacks in between the fins 202 and 204.

Although not explicitly shown in the figures, an interfacial oxide may be formed on the exposed surfaces of the fins 202 and 204 prior to the gate dielectric 1702 such that the gate dielectric 1702 is disposed on the fins 202 and 204 over the interfacial oxide. By way of example only, the interfacial oxide can be formed on the exposed surfaces of the fins 202 and 204 by a thermal oxidation, a chemical oxidation, or any other suitable oxide formation process. According to an exemplary embodiment, the interfacial oxide has a thickness of from about 0.5 nm to about 5 nm and ranges therebetween, e.g., about 1 nm.

Suitable materials for the gate dielectric 1702 include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as $HfO_2$, hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide (Pb(Sc,Ta)$O_3$) and/or lead zinc niobite (Pb(Zn,Nb)O). The high-κ material can further include dopants such as lanthanum (La), aluminum (Al) and/or magnesium (Mg). The gate dielectric 1702 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 1702 has a thickness of from about 1 nm to about 5 nm and ranges therebetween.

In one exemplary embodiment, the gate conductor 1704 includes a workfunction-setting metal or a combination of workfunction-setting metals. Suitable workfunction-setting metals include, but are not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC) titanium aluminum carbide (TiAlC), tantalum carbide (TaC) and/or hafnium carbide (HfC). The workfunction-setting metal(s) can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 1704 has a thickness of from about 5 nm to about 10 nm and ranges therebetween.

Figure 18A:
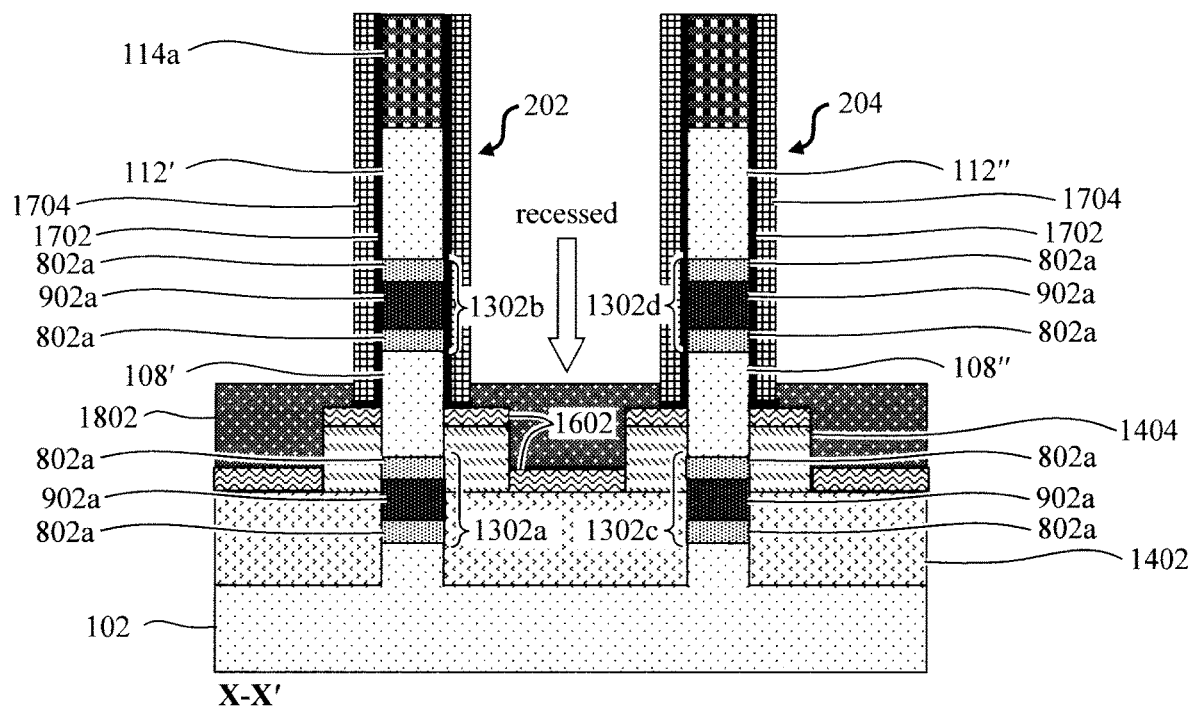
FIG. 18A is an X-X' cross-sectional view illustrating a (first) interlayer dielectric (ILD) having been deposited onto the bottom spacers and alongside the gate stacks, and recessed.
Figure 18B:
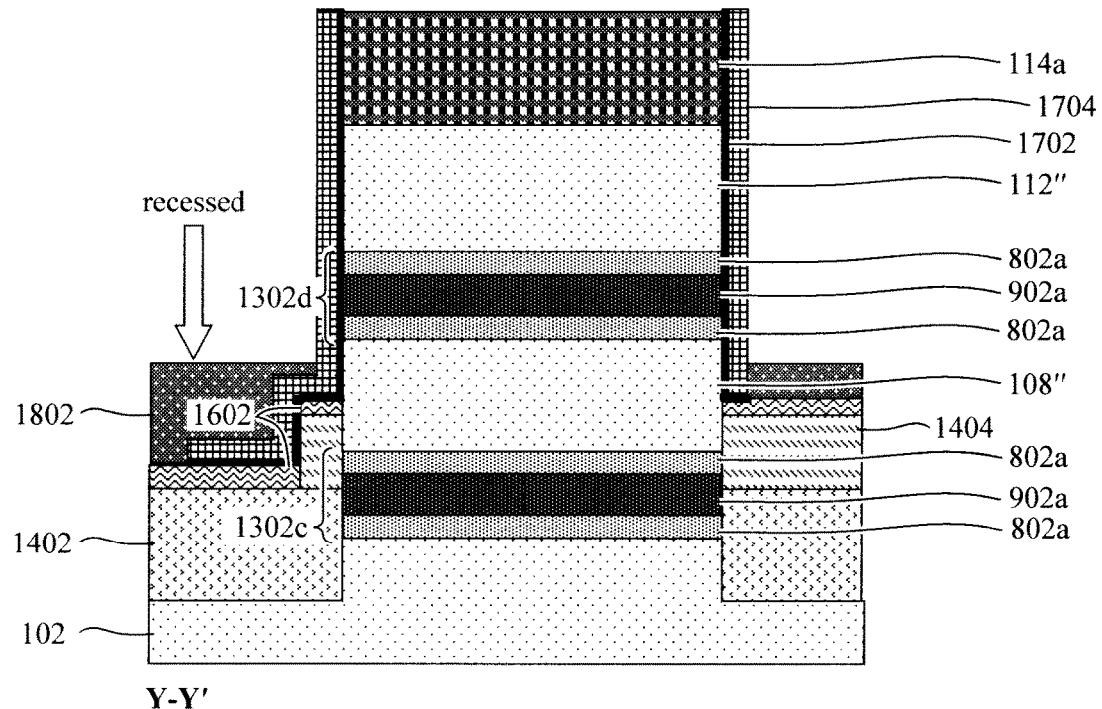
FIG. 18B is a Y-Y' cross-sectional view illustrating the first ILD having been deposited onto the bottom spacers and alongside the gate stacks, and recessed according to an embodiment of the present invention.

An interlayer dielectric (ILD) 1802 is then deposited onto the bottom spacers 1602 and alongside the gate stacks. See FIG. 18A (an X-X' cross-sectional view) and FIG. 18B (a Y-Y' cross-sectional view). Suitable materials for ILD 1802 include, but are not limited to, oxide materials such as SiOx and/or organosilicate glass (SiCOH) and/or ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as CVD, ALD, or PVD can be used to deposit the ILD 1802. Following deposition, the ILD 1802 can be polished using a process such as CMP, and then recessed. A non-directional (i.e., isotropic) etching process such as wet chemical etch or a gas phase etch can be employed to recess the ILD 1802. As shown in FIGS. 18A and 18B, a top surface of the recessed ILD 1802 is below a top surface of the patterned portions 108'/108" of the active layers.

Figure 19A:
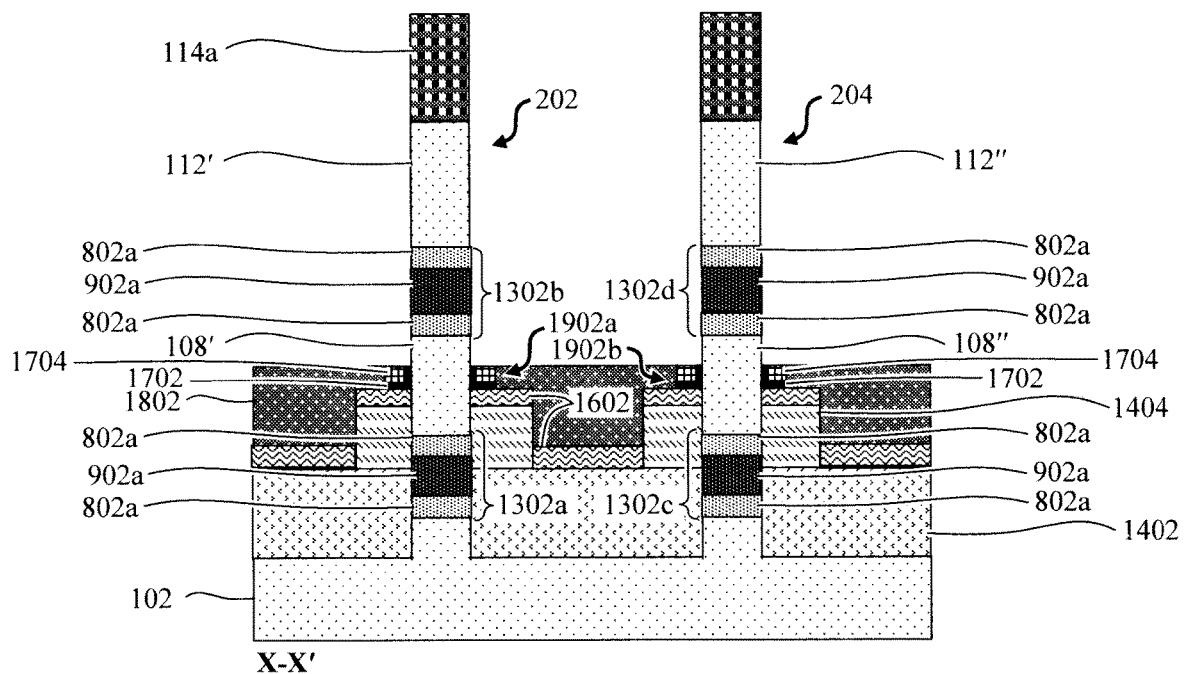
FIG. 19A is an X-X' cross-sectional view illustrating an etch having been performed to recess the gate stacks down to a height of the (recessed) first ILD forming gate stacks of the bottom VTFETs alongside the vertical fin channels of the bottom VTFETs.
Figure 19B:
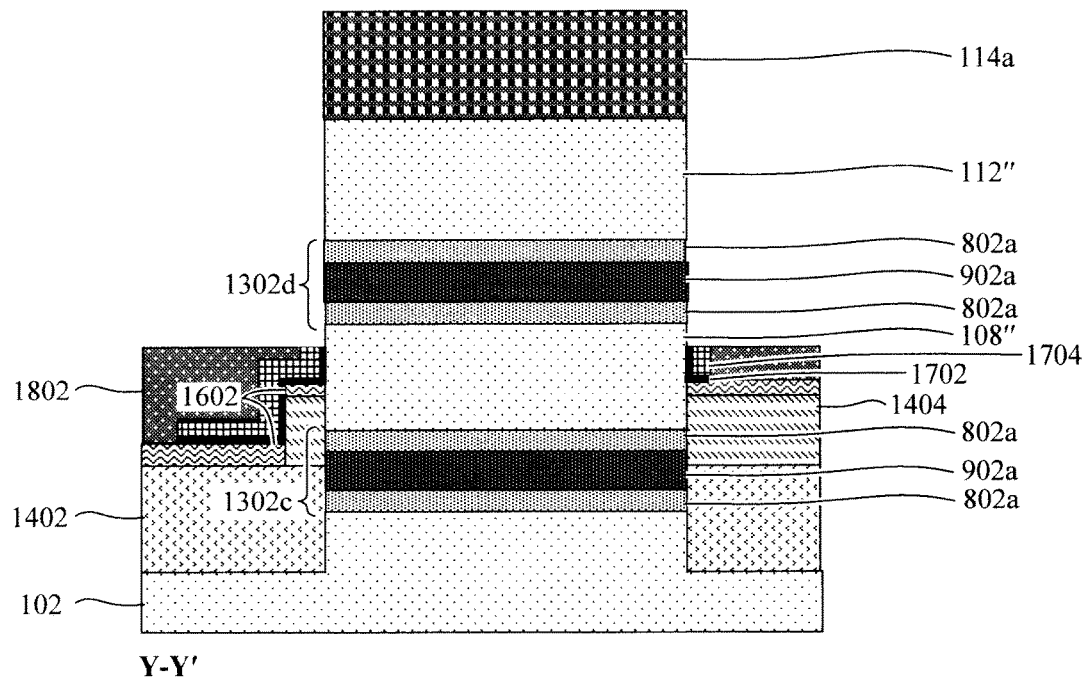
FIG. 19B is a Y-Y' cross-sectional view illustrating the etch having been performed to recess the gate stacks down to the height of the (recessed) first ILD forming gate stacks of the bottom VTFETs alongside the vertical fin channels of the bottom VTFETs according to an embodiment of the present invention.
Figure 20A:
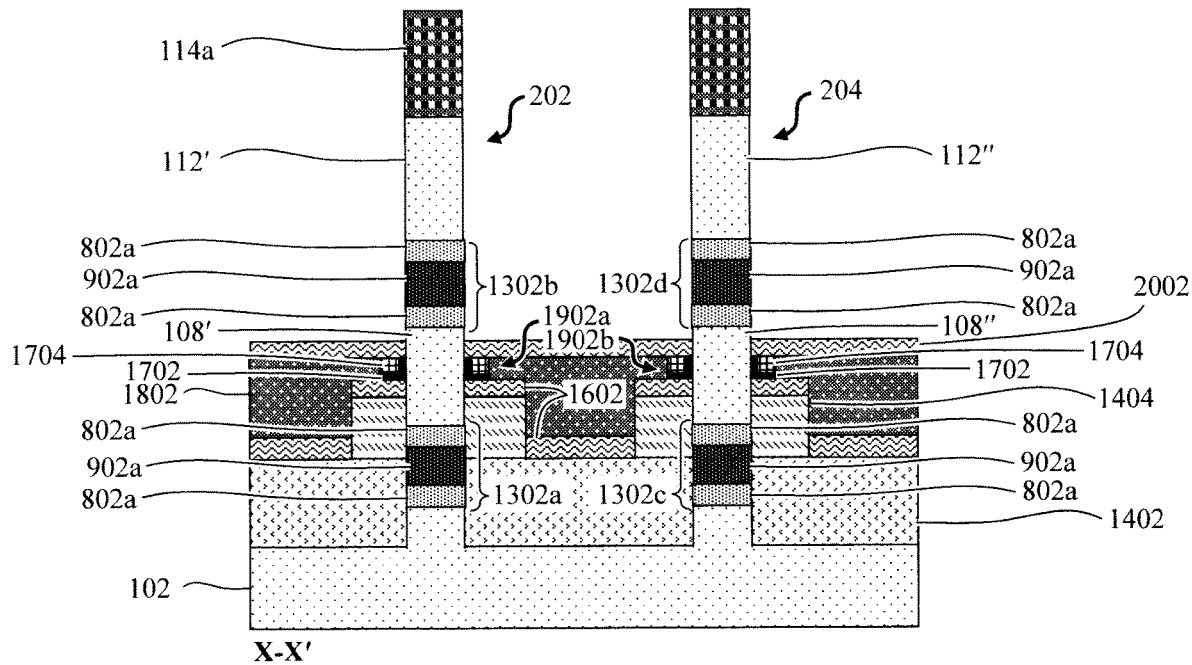
FIG. 20A is an X-X' cross-sectional view illustrating top spacers of the bottom VFETs having been formed on the first ILD over the gate stacks of the bottom VTFETs.
Figure 20B:
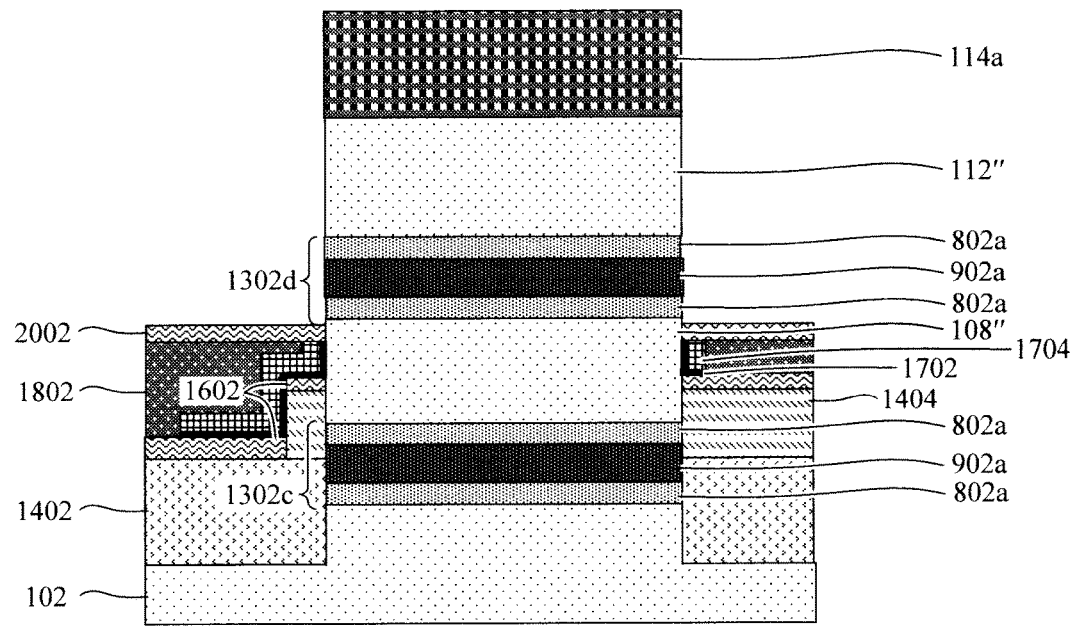
FIG. 20B is a Y-Y' cross-sectional view illustrating the top spacers of the bottom VFETs having been formed on the first ILD over the gate stacks of the bottom VTFETs according to an embodiment of the present invention.

An etch is then performed to recess the gate stacks (i.e., gate dielectric 1702 and a gate conductor 1704) down to a height of the (recessed) ILD 1802. See FIG. 19A (an X-X' cross-sectional view) and FIG. 19B (a Y-Y' cross-sectional view). A non-directional (i.e., isotropic) etching process such as a wet chemical etch or a gas phase etch can be employed to recess the gate stacks. As shown in FIGS. 19A and 19B, based on the height of the (recessed) ILD 1802, the gate dielectric 1702 and gate conductor 1704 are now present alongside only the patterned portions 108'/108" of the active layers. As highlighted above, the patterned portions 108'/108" of the active layers will serve as the vertical fin channels of the bottom VTFETs. The gate dielectric 1702 and gate conductor 1704 alongside the patterned portions 108'/108" of the active layers form gate stacks 1902a and 1902b of the bottom VTFETs alongside the vertical fin channels of the bottom VTFETs.

Top spacers 2002 of the bottom VFETs are formed on the ILD 1802 over the gate stacks 1902a and 1902b. See FIG. 20A (an X-X' cross-sectional view) and FIG. 20B (a Y-Y' cross-sectional view). Suitable materials for the top spacers 2002 include, but are not limited to, $SiO_2$ and/or SiOC. In the same manner as described above, the top spacers 2002 can be deposited using a directional deposition process, such as HDP, CVD or PVD, with a greater amount of the spacer material being deposited onto horizontal surfaces, followed by an etch to remove the spacer material from vertical surfaces resulting in formation of the top spacers 2002 shown in FIGS. 20A and 20B. According to an exemplary embodiment, the top spacers 2002 have a thickness of from about 2 nm to about 10 nm and ranges therebetween. In one embodiment, the as-formed top spacers 2002 are present alongside the patterned portions 108'/108" of the active layers.

A doped layer 2102 is next deposited onto the top spacers 2002 of the bottom VTFETs surrounding the fins 202 and 204, and then patterned in the same manner as described above. See FIG. 21A (an X-X' cross-sectional view) and FIG. 21B (a Y-Y' cross-sectional view). Like doped layer 1404, doped layer 2102 will serve as a dopant source (in this case for the top source/drain region of the bottom VTFETs) as well as a sacrificial layer for contact formation. Since doped layer 1404 and doped layer 2102 will be employed to form the bottom and top source/drain regions of the same devices, i.e., the bottom VTFETs, doped layer 2102 will contain dopants of the same polarity as doped layer 1404.

For instance, when the bottom VFETs are both NFETs (as in the instant example), then both doped layer 1404 and doped layer 2102 will serve as n-type dopant sources. In that case, both doped layer 1404 and doped layer 2102 can be formed from a material such as PSG. On the other hand, when the bottom VFETs are both PFETs, then both doped layer 1404 and doped layer 2102 will serve as p-type dopant sources. In that case, both doped layer 1404 and doped layer 2102 can be formed from a material such as BSG.

Figure 21A:
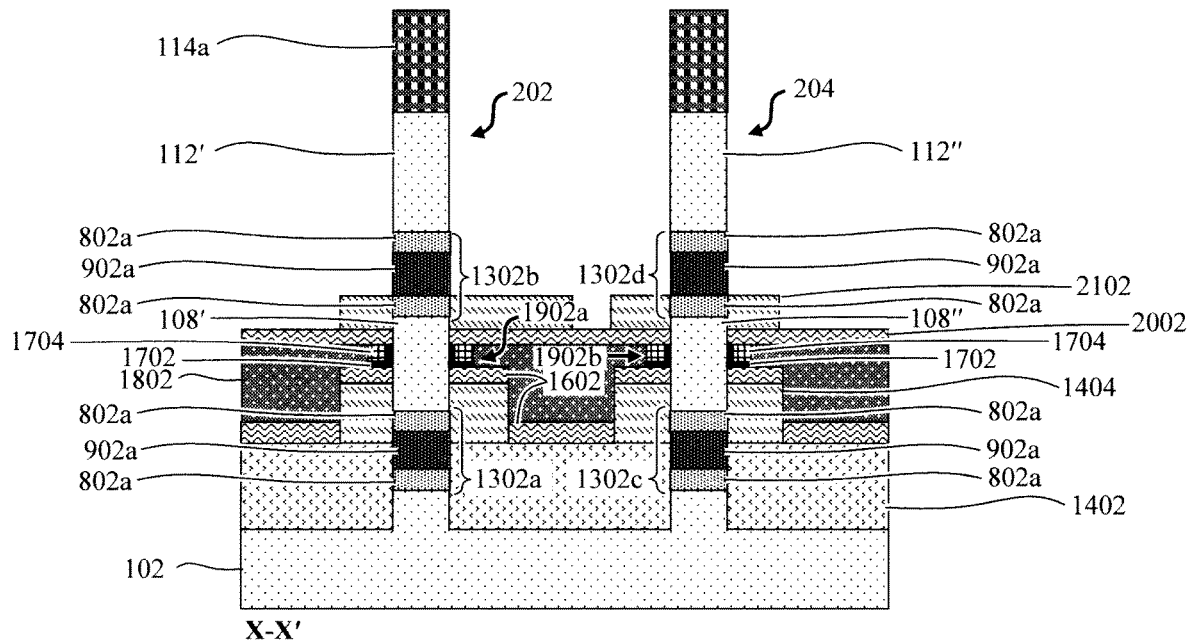
FIG. 21A is an X-X' cross-sectional view illustrating a (second) doped layer having been deposited onto the top spacers of the bottom VTFETs surrounding the fins, and then patterned.
Figure 21B:
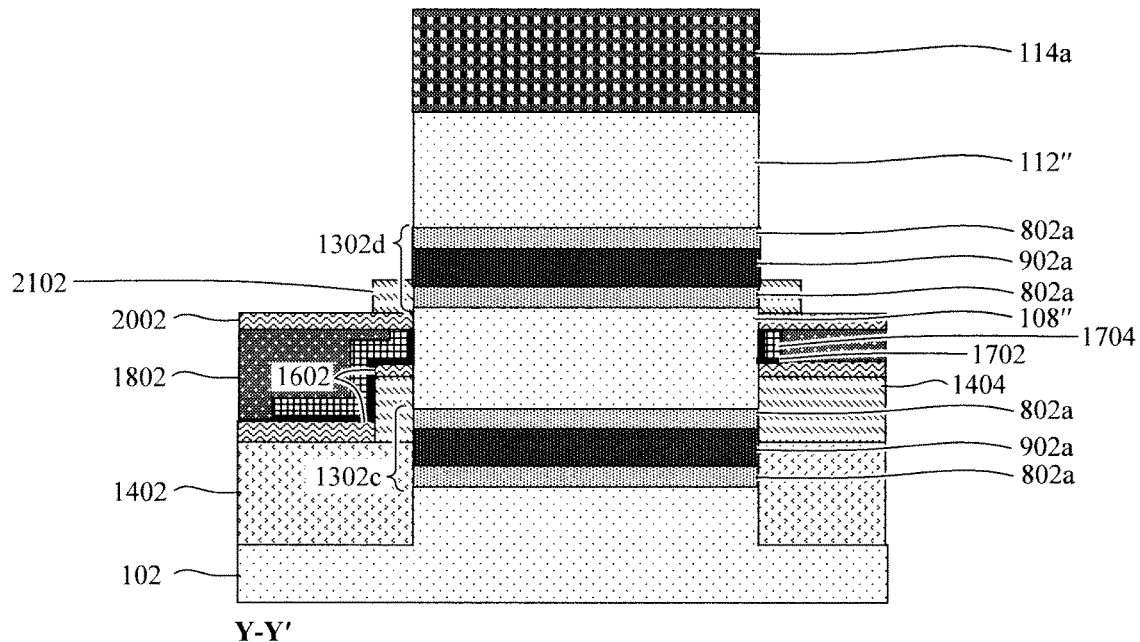
FIG. 21B is a Y-Y' cross-sectional view illustrating the second doped layer having been deposited onto the top spacers of the bottom VTFETs surrounding the fins, and then patterned according to an embodiment of the present invention.

In the same manner as described above, the doped layer 2102 can be deposited using a directional deposition process, such as HDP, CVD or PVD, with a greater amount of the material, i.e., PSG (or alternatively BSG), being deposited onto horizontal surfaces, followed by an etch to remove the material from vertical surfaces resulting in formation of the doped layer 2102 shown in FIGS. 21A and 21B. Standard lithography and etching techniques (see above) can be employed to pattern the doped layer 2102 between the fins 202 and 204. According to an exemplary embodiment, the as-patterned doped layer 2102 is present alongside the patterned portions 108'/108" of the active layers, and the lower second sacrificial layer 802a of the isolation structures 1302b and 1302d.

Figure 22A:
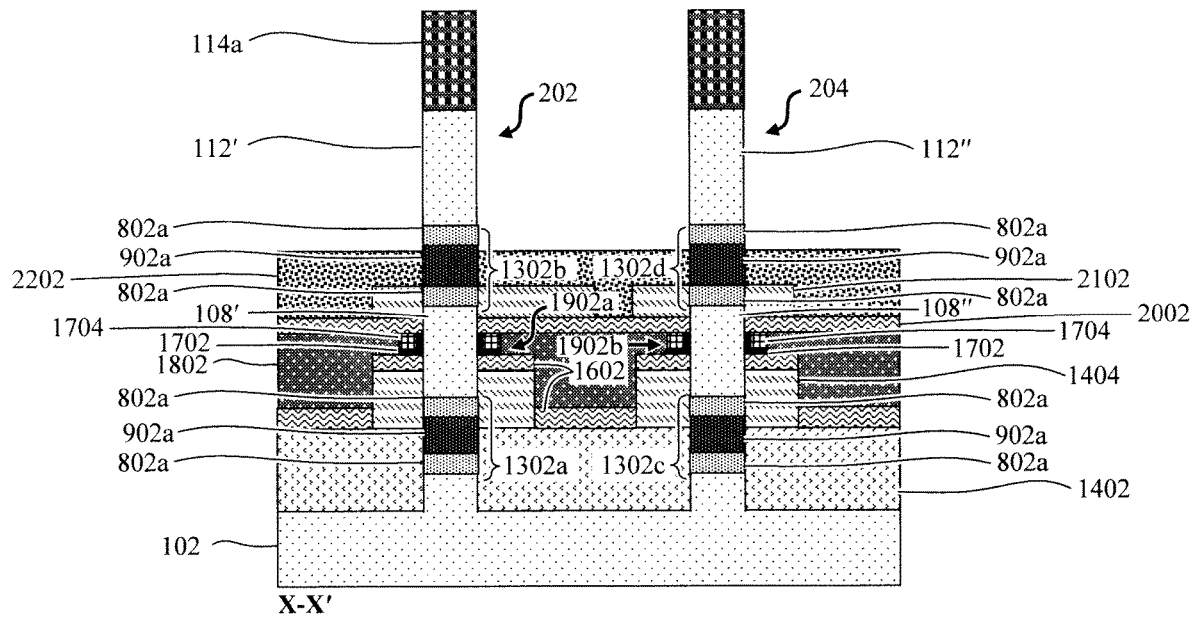
FIG. 22A is an X-X' cross-sectional view illustrating a second ILD having been deposited onto the top spacers of the bottom VTFETs over the (patterned) second doped layer.
Figure 22B:
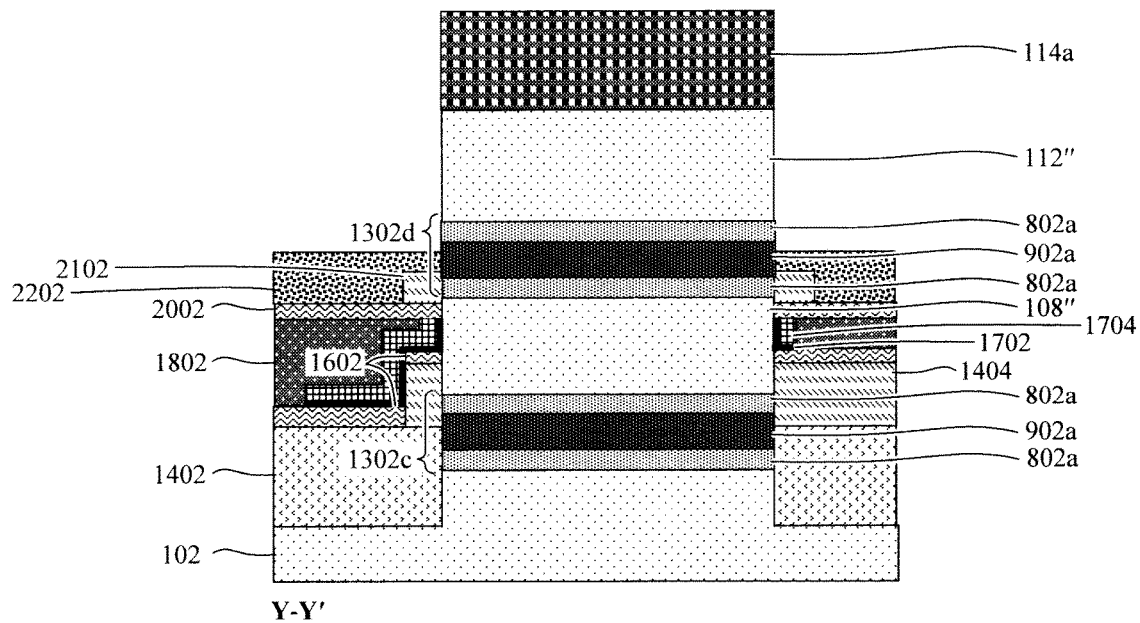
FIG. 22B is a Y-Y' cross-sectional view illustrating the second ILD having been deposited onto the top spacers of the bottom VTFETs over the (patterned) second doped layer according to an embodiment of the present invention.

An ILD 2202 is then deposited onto the top spacers 2002 over the (patterned) doped layer 2102. See FIG. 22A (an X-X' cross-sectional view) and FIG. 22B (a Y-Y' cross-sectional view). For clarity, the terms 'first' and 'second' may be used herein when referring to ILD 1802 and ILD 2202, respectively. Suitable materials for ILD 2202 include, but are not limited to, oxide materials such as SiOx and/or SiCOH and/or ULK-ILD materials such as pSiCOH. A process such as CVD, ALD, or PVD can be used to deposit the ILD 2002. Following deposition, the ILD 2202 can be polished using a process such as CMP, and then recessed. A non-directional (i.e., isotropic) etching process such as wet chemical etch or a gas phase etch can be employed to recess the ILD 2202. As shown in FIGS. 22A and 22B, a top surface of the recessed ILD 2202 is below a top surface of the patterned portions 112'/112" of the active layers.

A doped layer 2302 is next deposited onto the ILD 2202 surrounding the fins 202 and 204, and then patterned in the same manner as described above. See FIG. 23A (an X-X' cross-sectional view) and FIG. 23B (a Y-Y' cross-sectional view). Like doped layers 1404/2102, doped layer 2302 will serve as a dopant source (in this case for the bottom source/drain region of the top VTFETs) as well as a sacrificial layer for contact formation. Since doped layer 2302 will be employed to form the bottom source/drain regions of the complementary top devices, doped layer 2302 will contain dopants of the opposite polarity as doped layers 1404/2102. For instance, when the bottom VFETs are NFETs and the top VTFETs are PFETs (as in the instant example), then doped layers 1404/2102 will serve as n-type dopant sources while doped layer 2302 will serve as a p-type dopant source. In that case, doped layers 1404/2102 can be formed from a material such as PSG while doped layer 2302 is formed from a material such as BSG. On the other hand, when the bottom VFETs are PFETs and the top VTFETs are NFETs, then doped layers 1404/2102 will serve as p-type dopant sources while doped layer 2302 will serve as an n-type dopant source. In that case, doped layers 1404/2102 can be formed from a material such as BSG while doped layer 2302 is formed from a material such as PSG.

Figure 23A:
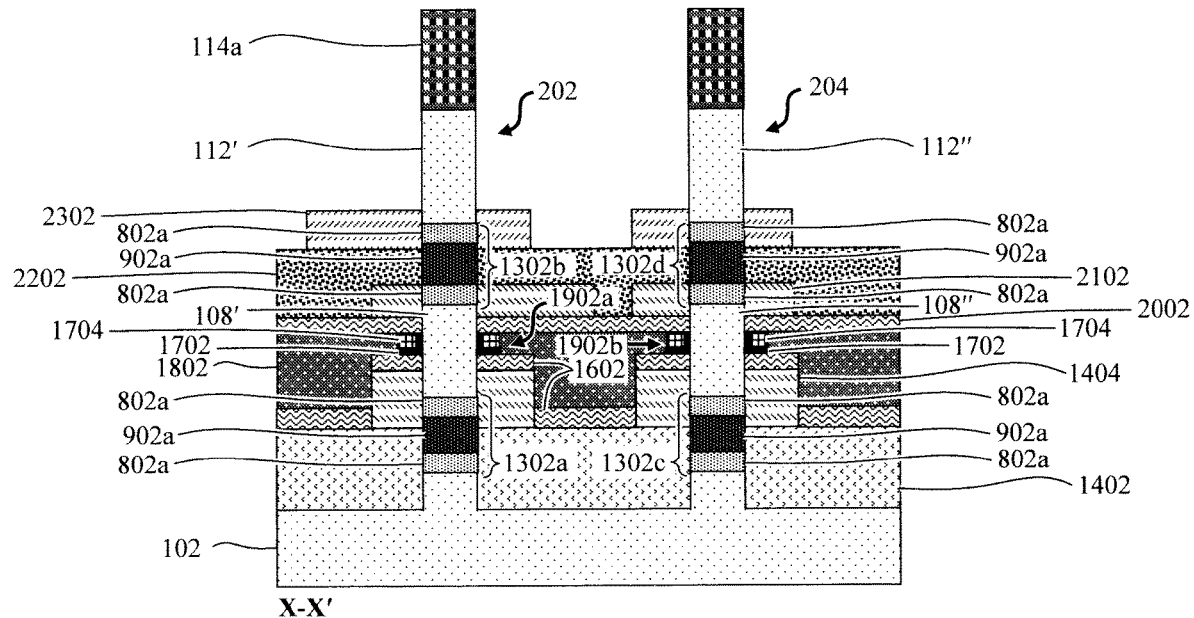
FIG. 23A is an X-X' cross-sectional view illustrating a (third) doped layer having been deposited onto the second ILD surrounding the first/second fins, and then patterned.
Figure 23B:
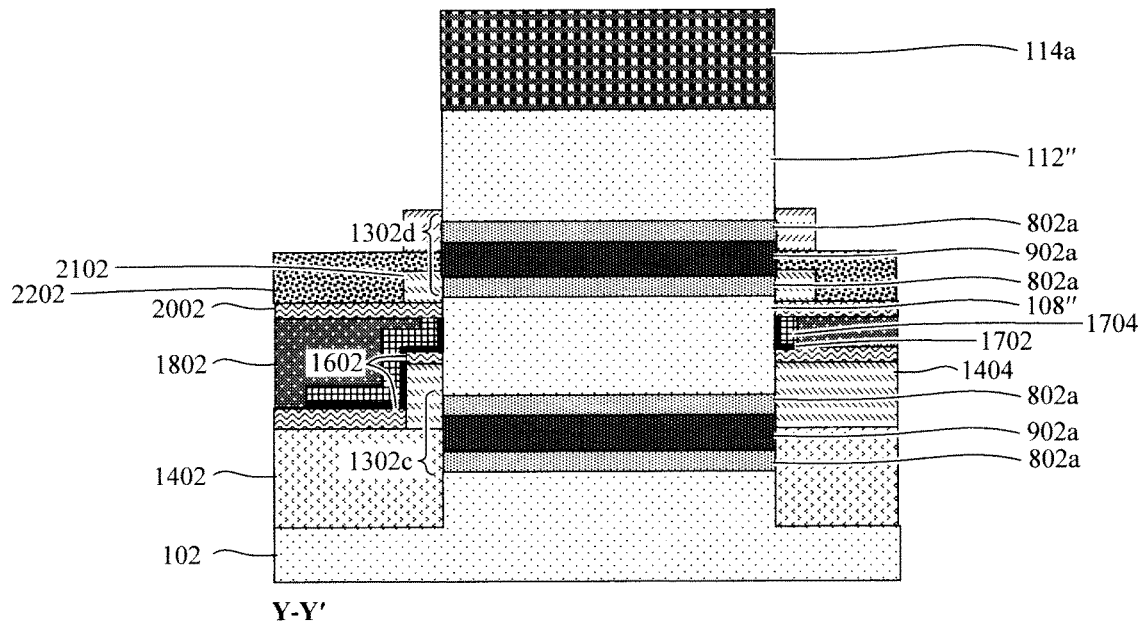
FIG. 23B is a Y-Y' cross-sectional view illustrating the third doped layer having been deposited onto the second ILD surrounding the first/second fins, and then patterned according to an embodiment of the present invention.
Figure 24A:
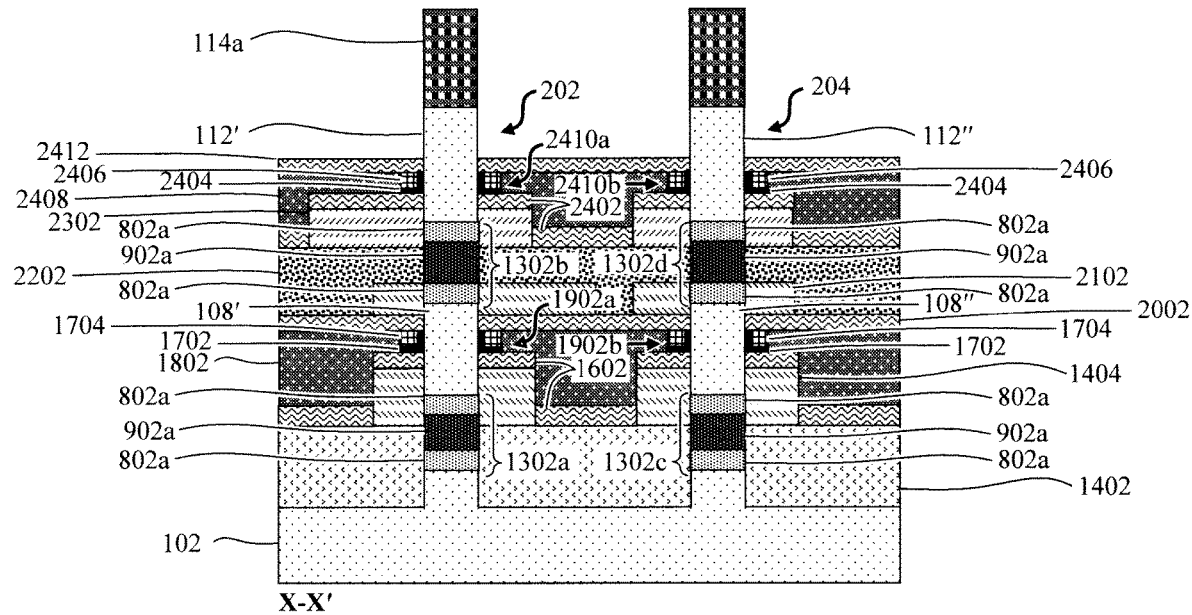
FIG. 24A is an X-X' cross-sectional view illustrating bottom spacers of the top VTFETs having been formed on the second ILD and (patterned) third doped layer, a gate dielectric and a gate conductor having been deposited alongside the first/second fins above the bottom spacers of the top VTFETs, a (third) ILD having been deposited onto the bottom spacers of the top VTFETs/alongside the gate dielectric/gate conductor and recessed, an etch having been performed to recess the gate dielectric/gate conductor down to a height of the (recessed) third ILD to form gate stacks of the top VTFETs, and top spacers of the top VTFETs having been formed on the third ILD over the gate stacks of the top VTFETs.
Figure 24B:
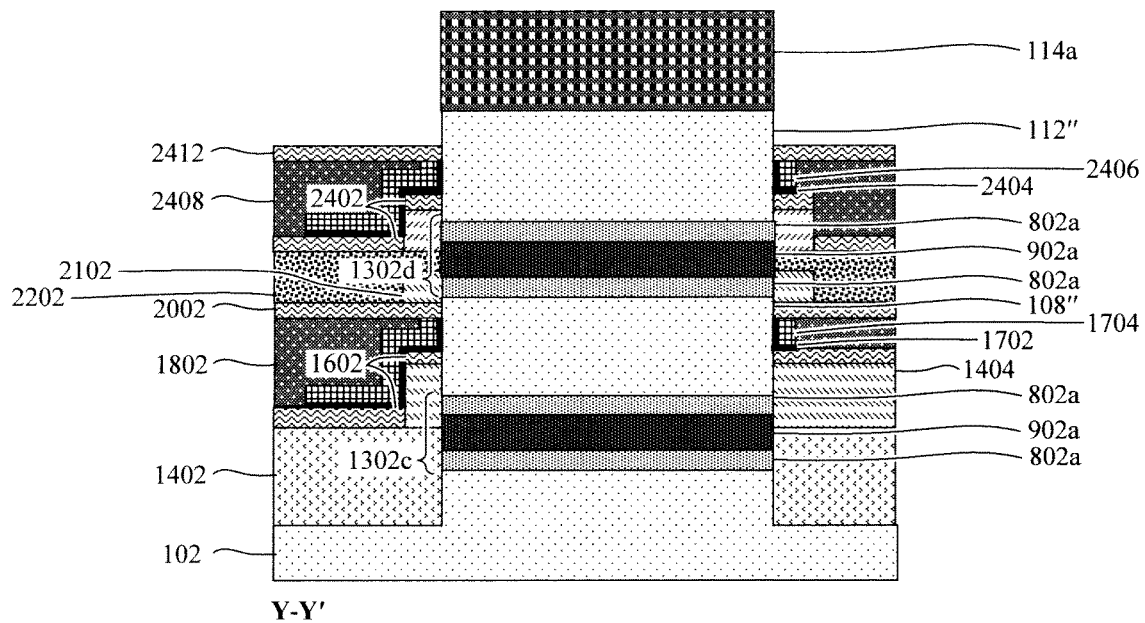
FIG. 24B is a Y-Y' cross-sectional view illustrating the bottom spacers of the top VTFETs having been formed on the second ILD and (patterned) third doped layer, the gate dielectric and the gate conductor having been deposited alongside the first/second fins above the bottom spacers of the top VTFETs, the third ILD having been deposited onto the bottom spacers of the top VTFETs/alongside the gate dielectric/gate conductor and recessed, the etch having been performed to recess the gate dielectric/gate conductor down to the height of the (recessed) third ILD to form the gate stacks of the top VTFETs, and the top spacers of the top VTFETs having been formed on the third ILD over the gate stacks of the top VTFETs according to an embodiment of the present invention.

In the same manner as described above, the doped layer 2302 can be deposited using a directional deposition process, such as HDP, CVD or PVD, with a greater amount of the material, i.e., BSG (or alternatively PSG), being deposited onto horizontal surfaces, followed by an etch to remove the material from vertical surfaces resulting in formation of the doped layer 2302 shown in FIGS. 23A and 23B. Standard lithography and etching techniques (see above) can be employed to pattern the doped layer 2302 between the fins 202 and 204. According to an exemplary embodiment, the as-patterned doped layer 2302 is present alongside the patterned portions 112'/112" of the active layers, and the upper second sacrificial layer 802a in the isolation structures 1302b and 1302d.

Following the same processes described above, bottom spacers 2402 of the top VTFETs are formed on the ILD 2202 and (patterned) doped layer 2302, a gate dielectric 2404 and a gate conductor 2406 are deposited alongside the fins 202 and 204 above the bottom spacers 2402, an ILD 2408 is then deposited onto the bottom spacers 2402/alongside the gate dielectric 2404/gate conductor 2406 and recessed, an etch is then performed to recess the gate dielectric 2404/gate conductor 2406 down to a height of the (recessed) ILD 2408 to form gate stacks 2410a and 2410b of the top VTFETs, and top spacers 2412 of the top VTFETs are formed on the ILD 2408 over the gate stacks 2410a and 2410b. See FIG. 24A (an X-X' cross-sectional view) and FIG. 24B (a Y-Y' cross-sectional view). It is notable that FIGS. 24A and 24B combine into a single figure multiple steps that were described individually above. Thus, reference may be made to the description above and corresponding figures for the details of any intermediary structures and/or steps that are not shown in FIGS. 24A and 24B.

Suitable materials for the bottom spacers 2402 include, but are not limited to, $SiO_2$ and/or SiOC. In the same manner as described above, the bottom spacers 2402 can be deposited using a directional deposition process, such as HDP, CVD or PVD, with a greater amount of the spacer material being deposited onto horizontal surfaces, followed by an etch to remove the spacer material from vertical surfaces resulting in formation of the bottom spacers 2402 shown in FIGS. 24A and 24B. According to an exemplary embodiment, the bottom spacers 2402 have a thickness of from about 2 nm to about 10 nm and ranges therebetween. In one embodiment, the as-formed bottom spacers 2402 are present alongside the patterned portions 112'/112" of the active layers.

Suitable materials for the gate dielectric 2404 include, but are not limited to, SiOx, SiN, SiOxNy, high-κ materials, or any combination thereof. As provided above, suitable high-κ materials include, but are not limited to, metal oxides such as $HfO_2$, HfSiO, HfSiO, $La_2O_3$, $LaAlO_3$, $ZrO_2$, $ZrSiO_4$, ZrSiOxNy, TaOx, TiO, $BaO_6SrTi_2$, $BaTiO_3$, $SrTiO_3$, $Y_2O_3$, $Al_2O_3$, $Pb(Sc,Ta)O_3$ and/or Pb(Zn,Nb)O. The high-κ material can further include dopants such as La, Al and/or Mg. The gate dielectric 2404 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 2404 has a thickness of from about 1 nm to about 5 nm and ranges therebetween.

Although not explicitly shown in the figures, an interfacial oxide may be formed (e.g., by thermal oxidation, chemical oxidation, etc.) on the exposed surfaces of the fins 202 and 204 prior to the gate dielectric 2404 such that the gate dielectric 2404 is disposed on the fins 202 and 204 over the interfacial oxide. According to an exemplary embodiment, the interfacial oxide has a thickness of from about 0.5 nm to about 5 nm and ranges therebetween, e.g., about 1 nm.

In one exemplary embodiment, the gate conductor 2406 includes a workfunction-setting metal or a combination of workfunction-setting metals. As provided above, suitable workfunction-setting metals include, but are not limited to, TiN, TiAlN, HfN, HfSiN, TaN, TaSiN, WN, MoN, NbN, TiC, TiAlC, TaC and/or HfC. The workfunction-setting metal(s) can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 2406 has a thickness of from about 5 nm to about 10 nm and ranges therebetween.

Suitable materials for ILD 2408 include, but are not limited to, oxide materials such as SiOx and/or SiCOH and/or ULK-ILD materials such as pSiCOH. A process such as CVD, ALD, or PVD can be used to deposit the ILD 2408. For clarity, the term 'third' may also be used herein when referring to ILD 2408 so as to distinguish it from the 'first' ILD 1802 and the 'second' ILD 2202. A non-directional (i.e., isotropic) etching process such as wet chemical etch or a gas phase etch can be employed to recess the ILD 2408. As highlighted above, the patterned portions 112'/112" of the active layers will serve as the vertical fin channels of the top VTFETs. The gate dielectric 2404 and gate conductor 2406 alongside the patterned portions 112'/112" of the active layers form the gate stacks 2410a and 2410b of the top VTFETs alongside the vertical fin channels of the top VTFETs.

Suitable materials for the top spacers 2412 include, but are not limited to, SiO$_2$ and/or SiOC. In the same manner as described above, the top spacers 2412 can be deposited using a directional deposition process, such as HDP, CVD or PVD, with a greater amount of the spacer material being deposited onto horizontal surfaces, followed by an etch to remove the spacer material from vertical surfaces resulting in formation of the top spacers 2412 shown in FIGS. 24A and 24B. According to an exemplary embodiment, the top spacers 2412 have a thickness of from about 2 nm to about 10 nm and ranges therebetween. In one embodiment, the as-formed top spacers 2412 are present alongside the patterned portions 112'/112" of the active layers.

Figure 25A:
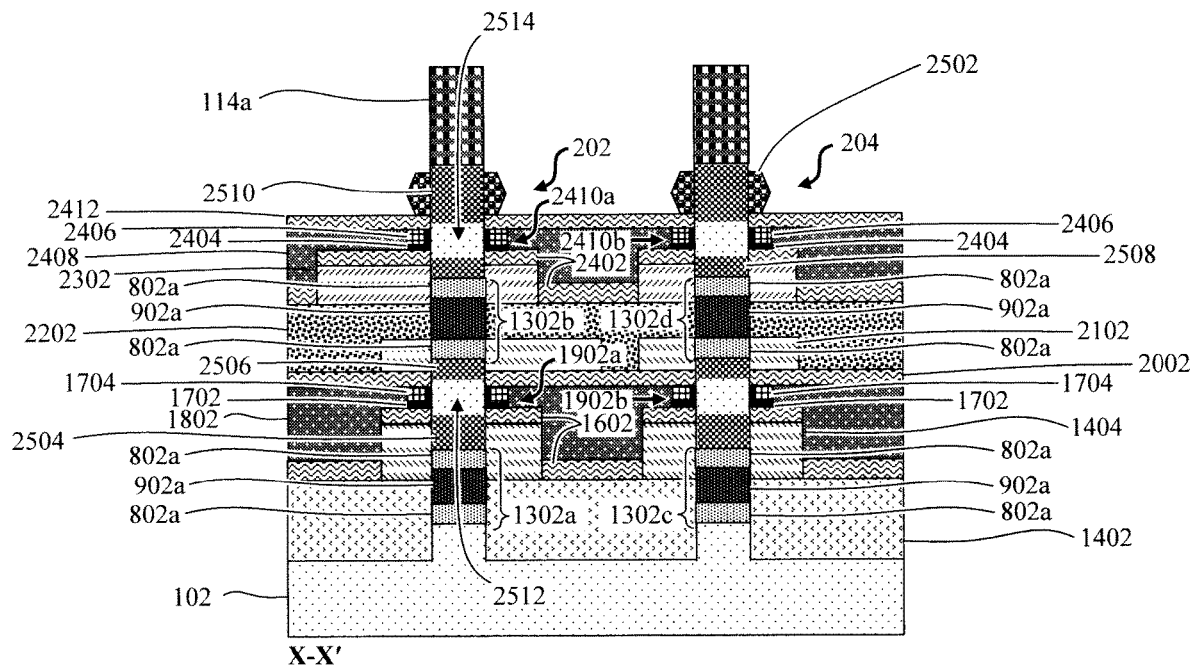
FIG. 25A is an X-X' cross-sectional view illustrating a doped epitaxial material having been grown alongside the patterned portions of the active layers above the top spacers of the top VTFETs, and a drive-in anneal having been used to drive dopants from the first/second/third doped layers and doped epitaxial material into the patterned portions of the active layers, forming (bottom/top) source/drain regions of the bottom VTFETs and (bottom/top) source/drain regions of the top VTFETs adjacent to the isolation structures.
Figure 25B:
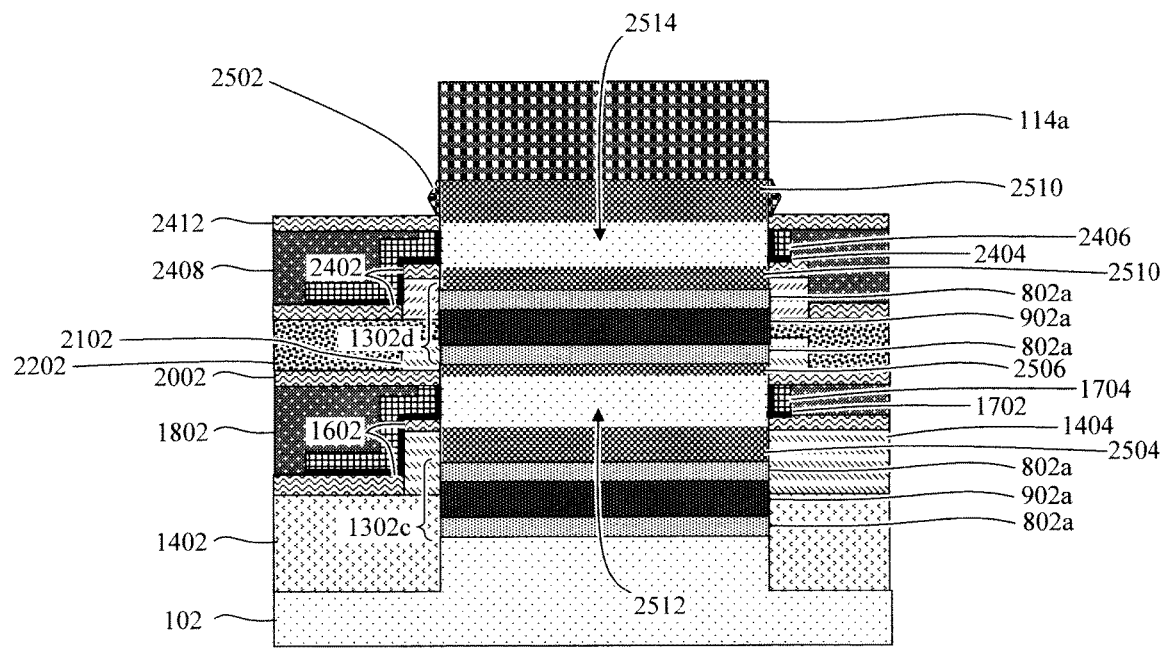
FIG. 25B is a Y-Y' cross-sectional view illustrating the doped epitaxial material having been grown alongside the patterned portions of the active layers above the top spacers of the top VTFETs, and the drive-in anneal having been used to drive dopants from the first/second/third doped layers and doped epitaxial material into the patterned portions of the active layers, forming the (bottom/top) source/drain regions of the bottom VTFETs and (bottom/top) source/drain regions of the top VTFETs adjacent to the isolation structures according to an embodiment of the present invention.
Figure 26A:
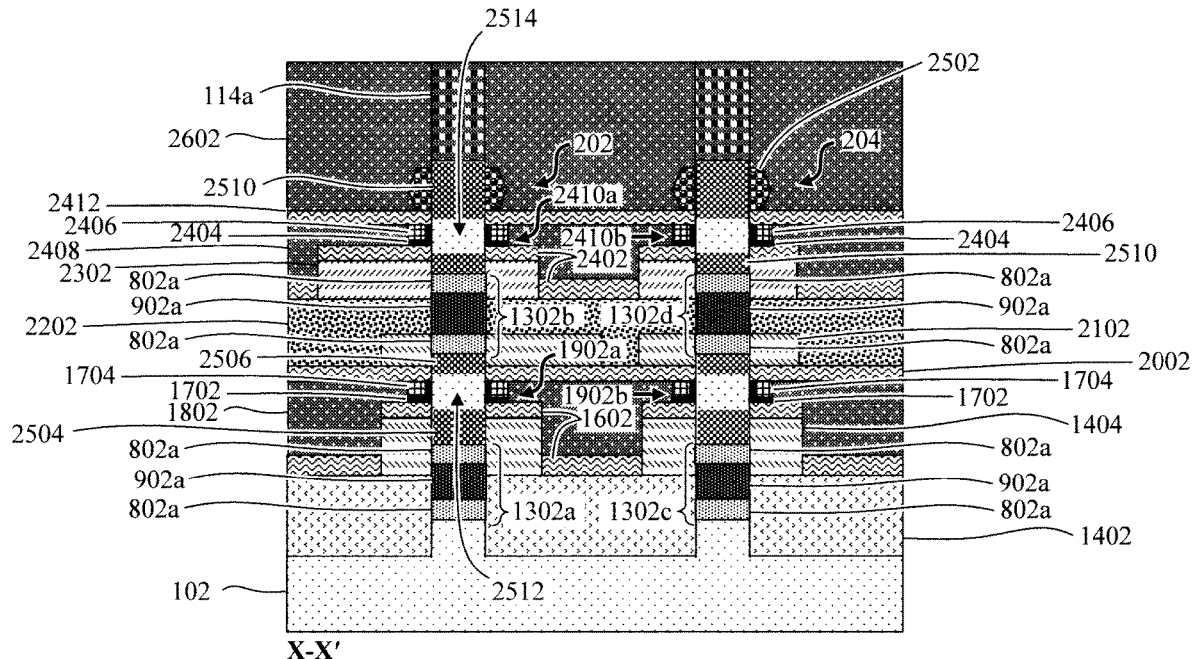
FIG. 26A is an X-X' cross-sectional view illustrating a (fourth) ILD having been deposited on the top spacers of the top VTFET and surrounding the doped epitaxial material and fin hardmasks.
Figure 26B:
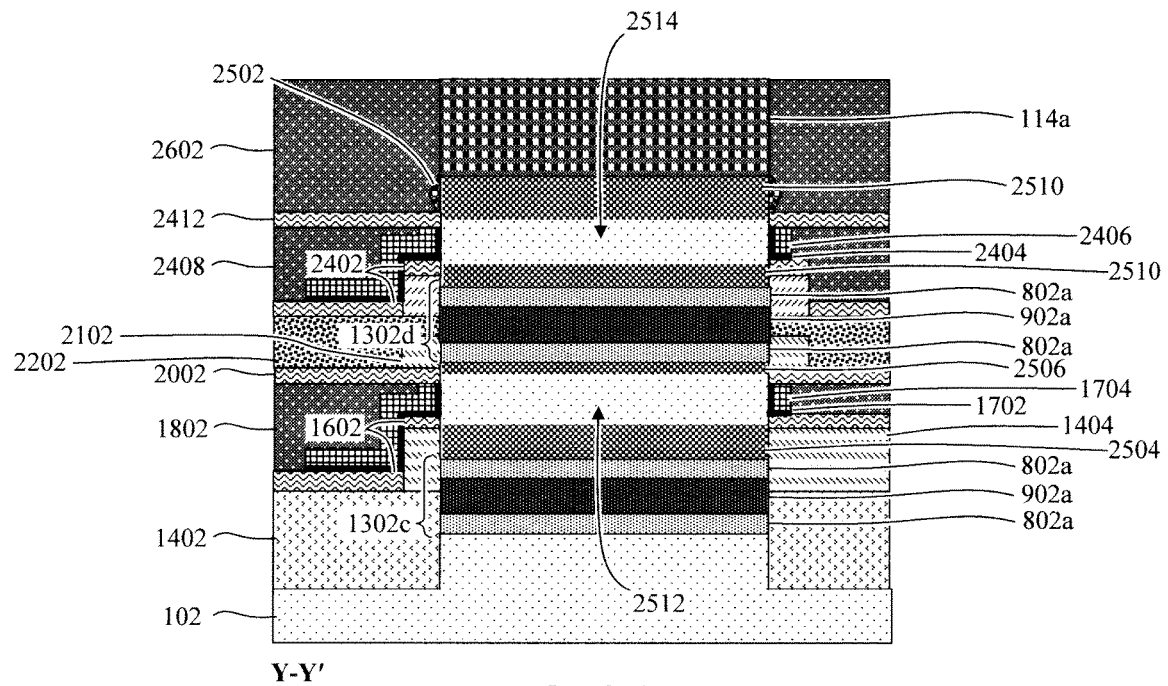
FIG. 26B is a Y-Y' cross-sectional view illustrating the fourth ILD having been deposited on the top spacers of the top VTFET and surrounding the doped epitaxial material and fin hardmasks according to an embodiment of the present invention.

A doped epitaxial material 2502 is then grown alongside the patterned portions 112'/112" of the active layers above the top spacers 2412, and a drive-in anneal is used to drive dopants from the doped layers 1404/2102 and doped layer 2302/doped epitaxial material 2502 into the patterned portions 108'/108" and 112'/112" of the active layers, forming (bottom/top) source/drain regions 2504 and 2506 of the bottom VTFETs and (bottom/top) source/drain regions 2508 and 2510 of the top VTFETs, respectively, adjacent to the isolation structures 1302a,b,c,d. See FIG. 25A (an X-X' cross-sectional view) and FIG. 25B (a Y-Y' cross-sectional view). As shown in FIGS. 25A and 25B, the regions of the patterned portions 108'/108" and 112'/112" of the active layers interconnecting the bottom/top source/drain regions 2504/2506 and 2508/2510 serve as the vertical fin channels 2512 and 2514 of the bottom VTFETs and top VTFETs, respectively.

Suitable doped epitaxial materials include, but are not limited to, in-situ doped (i.e., during growth) or ex-situ doped (e.g., via ion implantation) epitaxial Si and/or epitaxial SiGe. As shown in FIGS. 25A and 25B, growth of the doped epitaxial material 2502 will be limited to the vertical surfaces of the patterned portions 112'/112" of the active layers that are exposed over the top spacers 2412 (and below the fin hardmasks 114a). The doped epitaxial material 2502 is doped with an n-type or a p-type dopant. Suitable n-type dopants include, but are not limited to, phosphorous (P) and/or arsenic (As). Suitable p-type dopants include, but are not limited to, boron (B).

According to an exemplary embodiment, the doped epitaxial material 2502 contains a dopant(s) of the same polarity as doped layer 2302, and with the opposite polarity from the doped layers 1404/2102. Thus, using the example above as a non-limiting illustration, if the doped layers 1404/2102 are formed from PSG (with phosphorous as the dopant) and doped layer 2302 is formed from BSG (with boron as the dopant) then, like doped layer 2302, doped epitaxial material 2502 will contain a p-type dopant like boron. Alternatively, if the doped layers 1404/2102 are formed from BSG (with boron as the dopant) and doped layer 2302 is formed from PSG (with phosphorous as the dopant) then, like doped layer 2302, doped epitaxial material 2502 will contain an n-type dopant like phosphorous or arsenic. The drive-in anneal is then used to drive these dopants from the doped layers 1404/2102 and doped layer 2302/doped epitaxial material 2502 into the patterned portions 108'/108" and 112'/112" of the active layers to form the bottom/top source/drain regions 2504 and 2506 of the bottom VTFETs and bottom/top source/drain regions 2508 and 2510 of the top VTFETs, respectively. According to an exemplary embodiment, the drive-in anneal is performed at a temperature of from about 950 degrees Celsius (° C.) to about 1050° C. and ranges therebetween.

As provided above, the doped layers 1404, 2102, 2302 will also serve as a sacrificial material during source/drain contact formation, whereby the doped layers 1404, 2102, 2302 can be selectively removed (which provides access to the bottom/top source/drain regions 2504 and 2506 of the bottom VTFETs and/or the bottom/top source/drain regions 2508 and 2510 of the top VTFETs) and replaced with a contact metal(s). This process will now be described.

To begin, an ILD 2602 is first deposited on the top spacers 2412 and surrounding the doped epitaxial material 2502 and fin hardmasks 114a. See FIG. 26A (an X-X' cross-sectional view) and FIG. 26B (a Y-Y' cross-sectional view). For clarity, the term 'fourth' may also be used herein when referring to ILD 2602 so as to distinguish it from the 'first' ILD 1802, the 'second' ILD 2202, and the 'third' ILD 2408. Suitable materials for ILD 2602 include, but are not limited to, oxide materials such as SiOx and/or SiCOH and/or ULK-ILD materials such as pSiCOH. A process such as CVD, ALD, or PVD can be used to deposit the ILD 2602. Following deposition, the ILD 2602 can be polished down to a top surface of the fin hardmasks 114a using a process such as CMP.

Figure 27A:
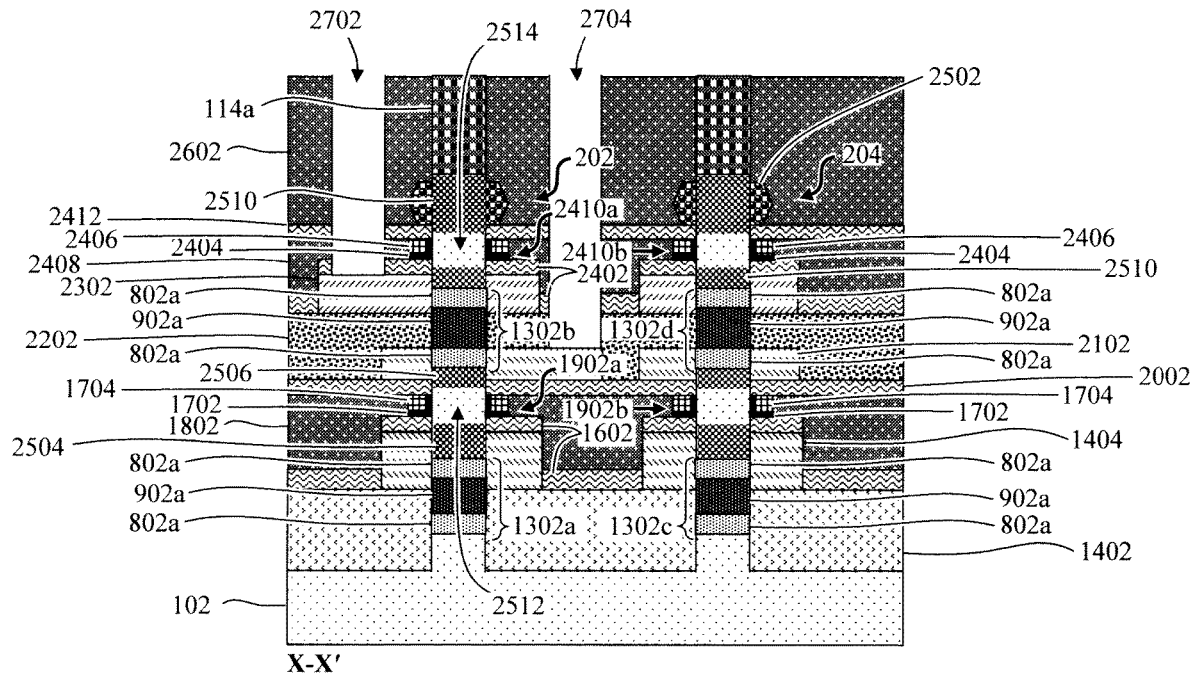
FIG. 27A is an X-X' cross-sectional view illustrating contact trenches having been patterned over the first, second and/or third doped layers.
Figure 27B:
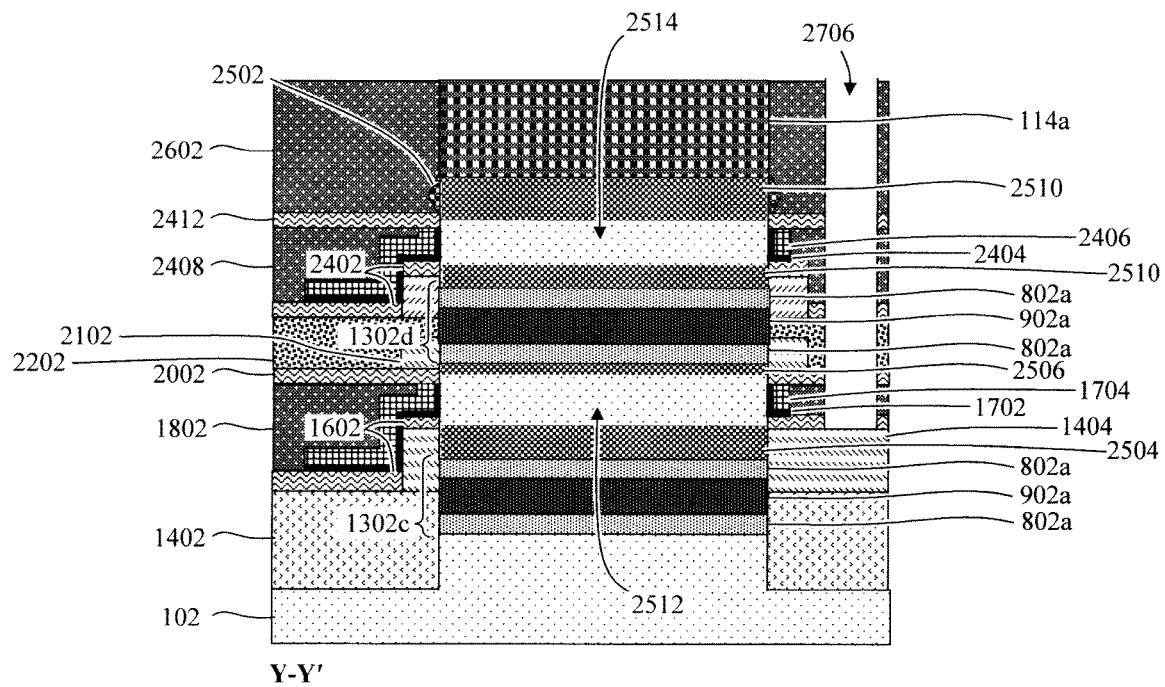
FIG. 27B is a Y-Y' cross-sectional view illustrating the contact trenches having been patterned over the first, second and/or third doped layers according to an embodiment of the present invention.
Figure 28A:
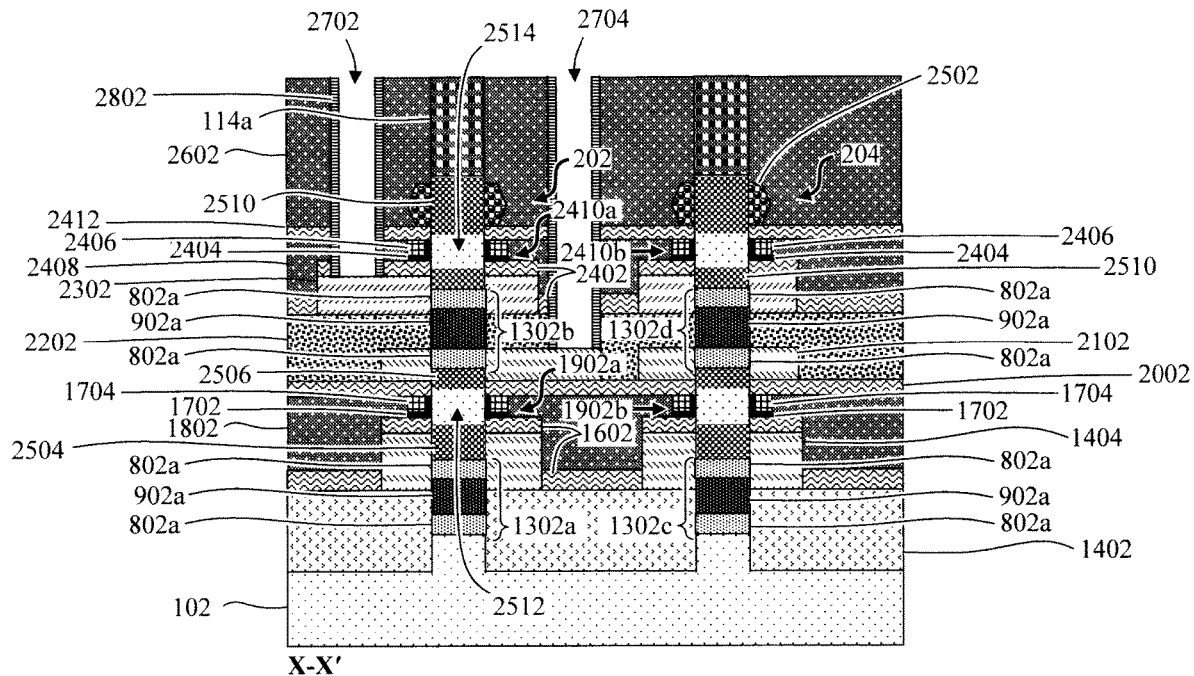
FIG. 28A is an X-X' cross-sectional view illustrating a sidewall liner having been formed lining the sidewalls of the contact trenches.
Figure 28B:
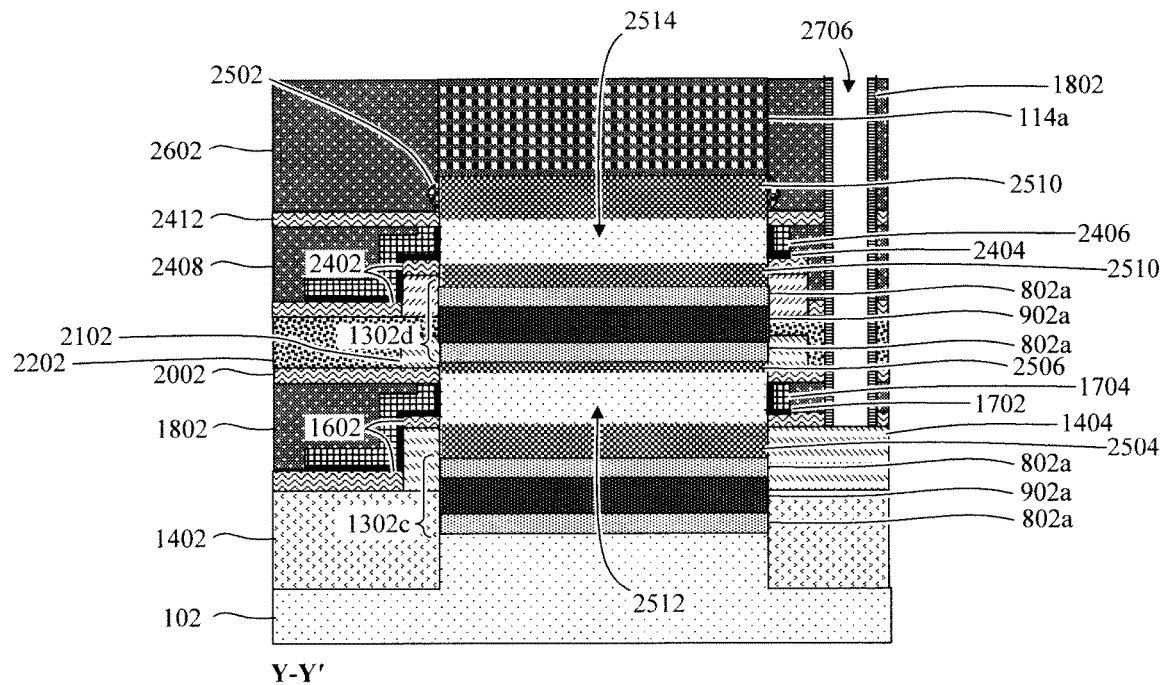
FIG. 28B is a Y-Y' cross-sectional view illustrating the sidewall liner having been formed lining the sidewalls of the contact trenches according to an embodiment of the present invention.
Figure 29A:
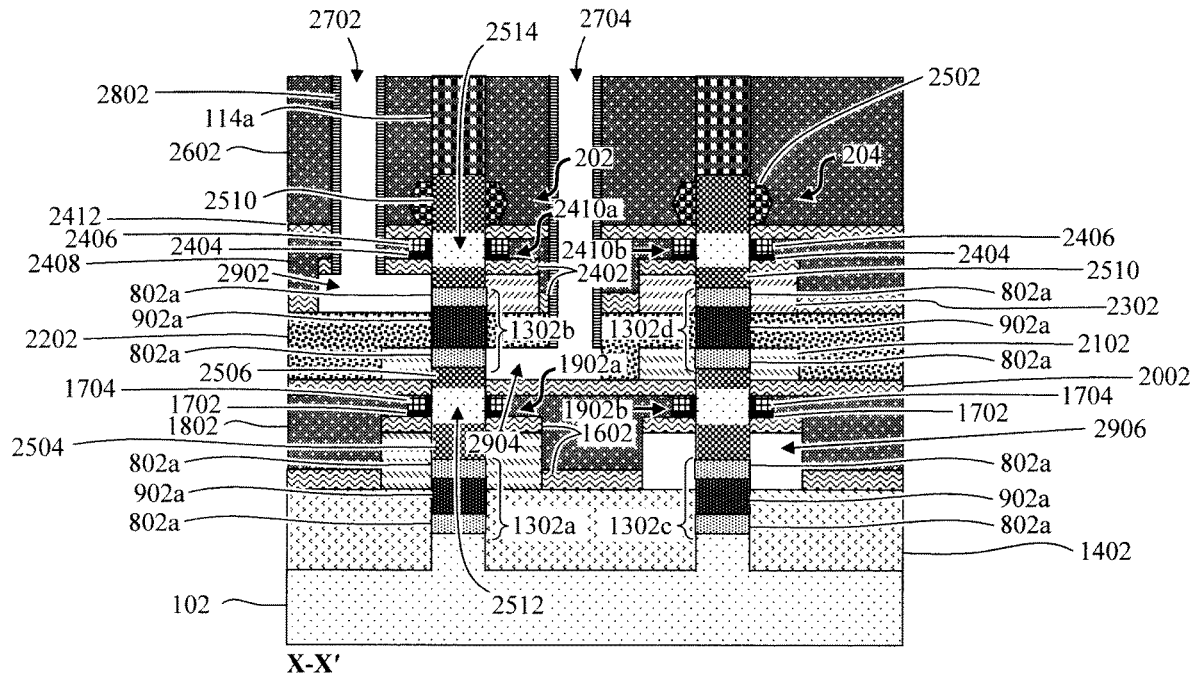
FIG. 29A is an X-X' cross-sectional view illustrating the first/second/third doped layers having been removed from the top and bottom VTFETs through the contact trenches forming cavities alongside the upper/lower second sacrificial layers of the isolation structure in the top VTFETs along the first fin, and alongside the upper second sacrificial layer of the isolation structure in the bottom VTFET along second fin.
Figure 29B:
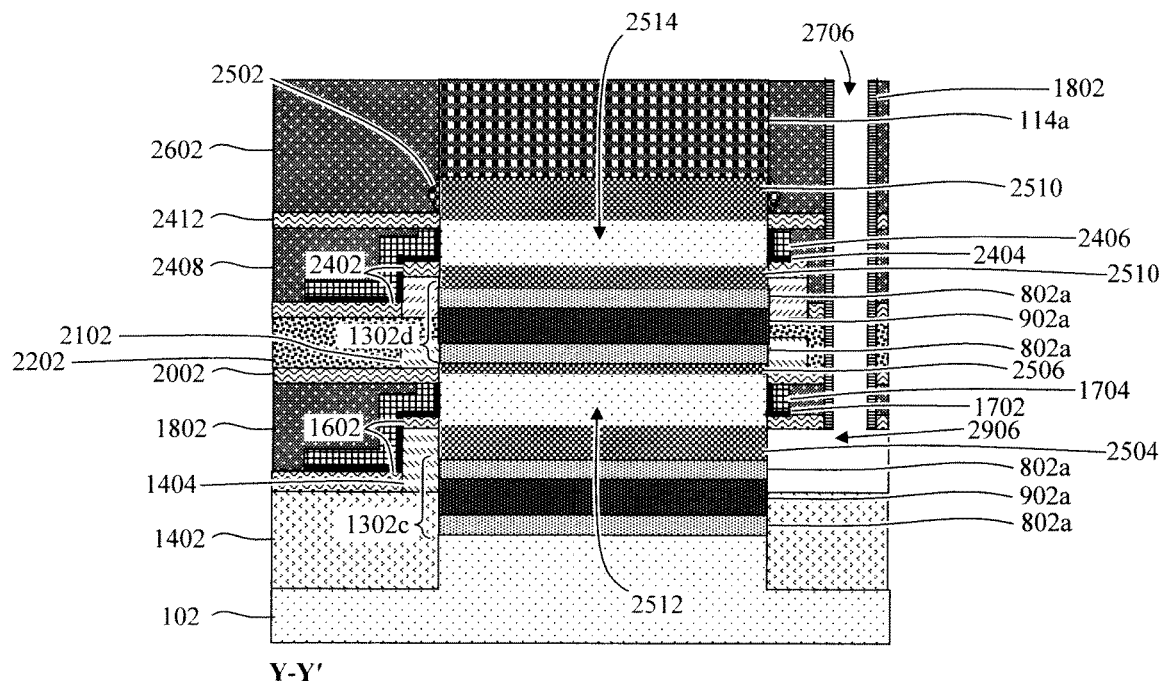
FIG. 29B is a Y-Y' cross-sectional view illustrating the first/second/third doped layers having been removed from the top and bottom VTFETs through the contact trenches forming the cavities alongside the upper/lower second sacrificial layers of the isolation structure in the top VTFETs along the first fin, and alongside the upper second sacrificial layer of the isolation structure in the bottom VTFET along second fin according to an embodiment of the present invention.
Figure 30A:
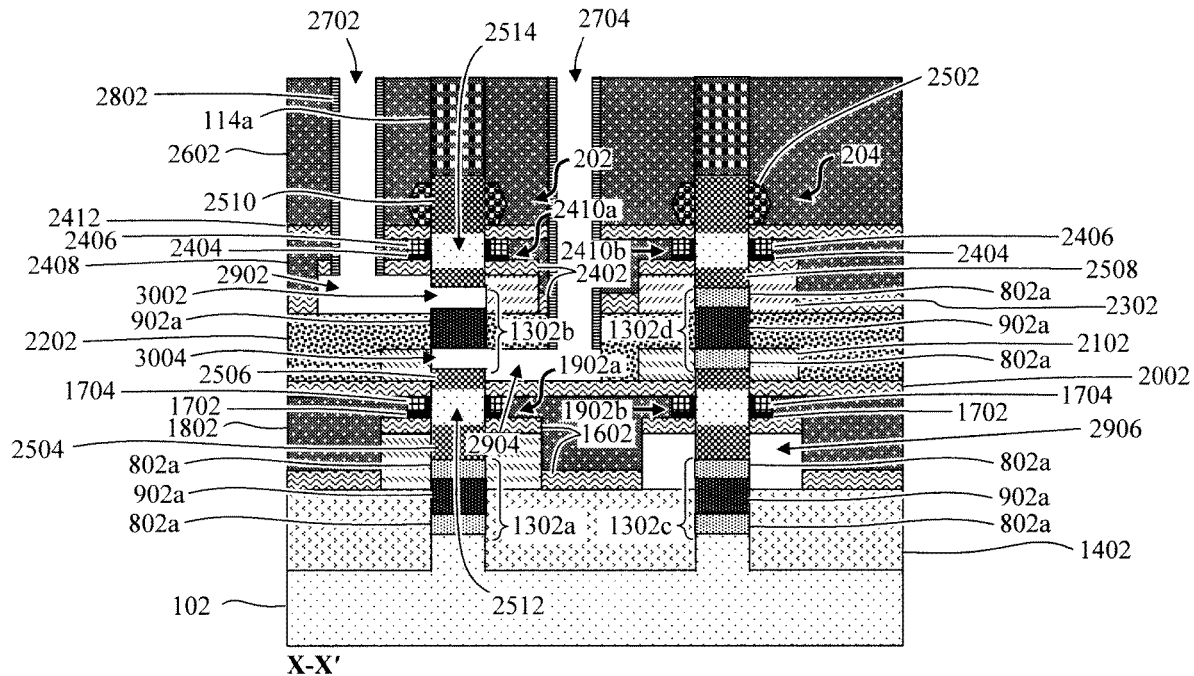
FIG. 30A is an X-X' cross-sectional view illustrating the upper/lower second sacrificial layers of the isolation structure in the top VTFETs along the first fin, and the upper second sacrificial layer of the isolation structure in the bottom VTFET along the second fin having been selectively removed through the contact trenches and cavities forming an aperture below the bottom source/drain region of the top VTFET along the first fin, an aperture above the top source/drain region of the bottom VTFET along the first fin, and an aperture below the bottom source/drain region of the bottom VTFET along the second fin.
Figure 30B:
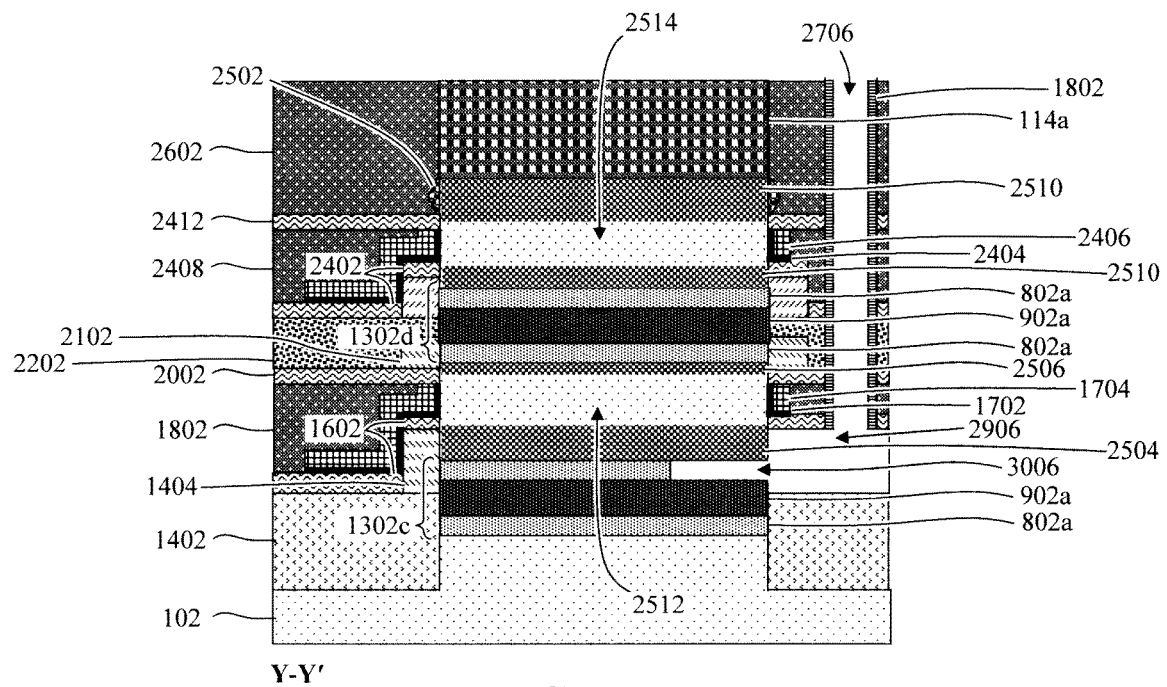
FIG. 30B is a Y-Y' cross-sectional view illustrating the upper/lower second sacrificial layers of the isolation structure in the top VTFETs along the first fin, and the upper second sacrificial layer of the isolation structure in the bottom VTFET along the second fin having been selectively removed through the contact trenches and cavities forming the aperture below the bottom source/drain region of the top VTFET along the first fin, the aperture above the top source/drain region of the bottom VTFET along the first fin, and the aperture below the bottom source/drain region of the bottom VTFET along the second fin according to an embodiment of the present invention.
Figure 31A:
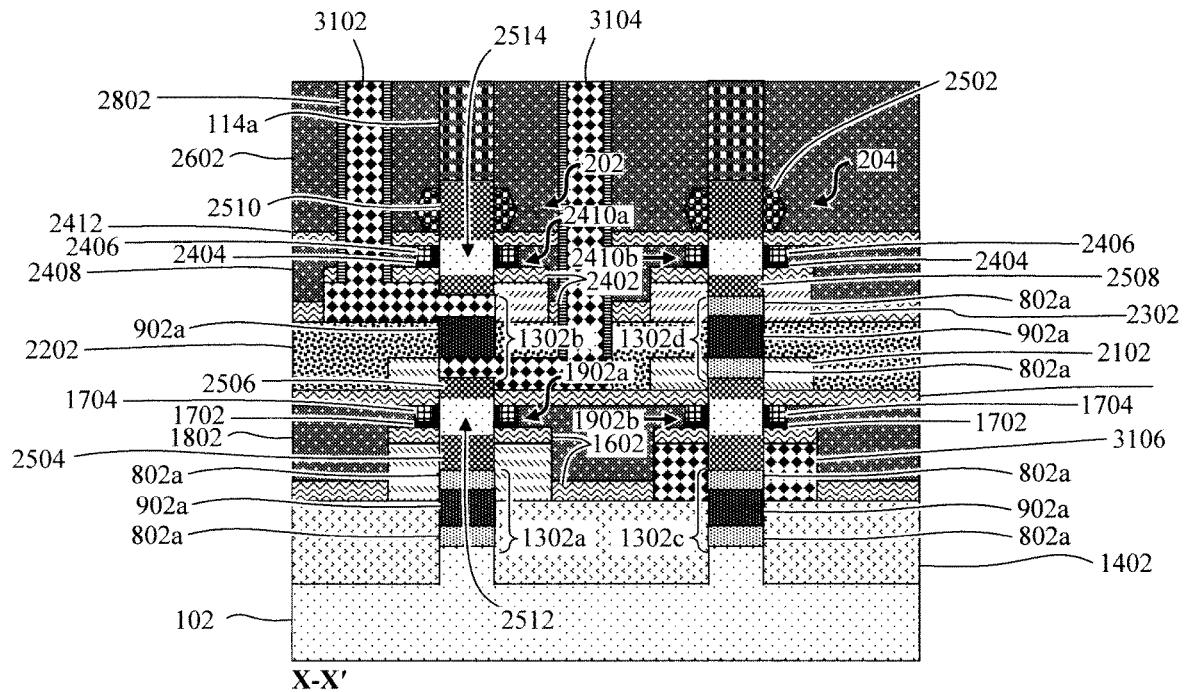
FIG. 31A is an X-X' cross-sectional view illustrating a contact metal(s) having been deposited into, and filling, the contact trenches, cavities and apertures to form source/drain contacts to the bottom source/drain region of the top VTFET along the first fin, the top source/drain region of the bottom VTFET along the first fin and the bottom source/drain region of the bottom VTFET along the second fin.
Figure 31B:
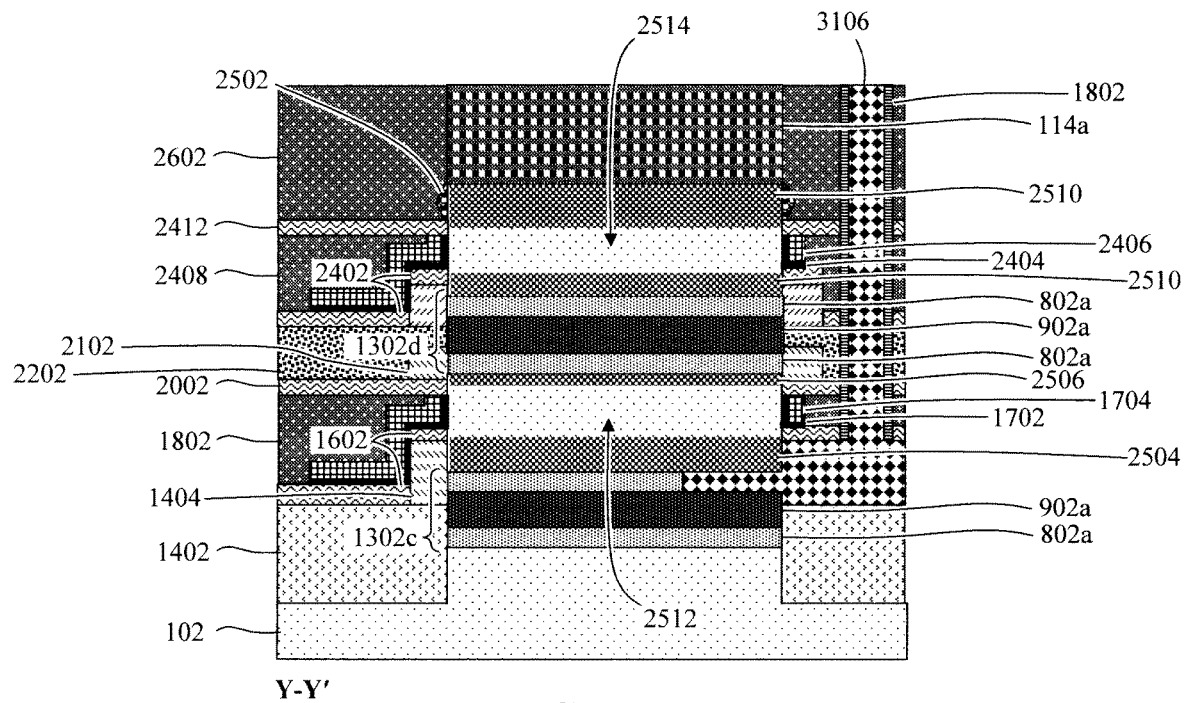
FIG. 31B is a Y-Y' cross-sectional view illustrating the contact metal(s) having been deposited into, and filling, the contact trenches, cavities and apertures to form the source/drain contacts to the bottom source/drain region of the top VTFET along the first fin, the top source/drain region of the bottom VTFET along the first fin and the bottom source/drain region of the bottom VTFET along the second fin according to an embodiment of the present invention.

Standard lithography and etching techniques (see above) are then used to pattern contact trenches 2702, 2704 and 2706 over the doped layer 2302, the doped layer 2102 and the doped layer 1404, respectively. See FIG. 27A (an X-X' cross-sectional view) and FIG. 27B (a Y-Y' cross-sectional view). As shown in FIGS. 27A and 27B, contact trench 2702 extends through the ILD 2602, top spacers 2412, ILD 2408 and bottom spacers 2402, down to (and exposing) the doped layer 2302. Contact trench 2704 extends through the ILD 2602, top spacers 2412, ILD 2408, bottom spacers 2402 and ILD 2202, down to (and exposing) the doped layer 2102. Contact trench 2706 extends through the ILD 2602, top spacers 2412, ILD 2408, bottom spacers 2402, ILD 2202, top spacers 2002, ILD 1802 and bottom spacers 1602, down to (and exposing) the doped layer 1404. A directional (i.e., anisotropic) etching process such as RIE can be employed for the contact trench etch. As would be apparent to one skilled in the art, the contact trenches 2702, 2704 and 2706 may need to be formed separately due to the variations in their depths.

A sidewall liner 2802 is then formed lining the sidewalls of the contact trenches 2702, 2704 and 2706. See FIG. 28A (an X-X' cross-sectional view) and FIG. 28B (a Y-Y' cross-sectional view). Suitable liner materials include, but are not limited to, nitride spacer materials such as SiN and/or SiON, which can be deposited using a process such as CVD, ALD or PVD. Following deposition, a directional (i.e., anisotropic) etching process such as RIE can be employed to pattern the liner material into the sidewall liner 2802 shown in FIGS. 28A and 28B along the sidewalls of the contact trenches 2702, 2704 and 2706. A nitride material is preferable for this sidewall spacer application since, as will be described below, the next task is to remove the doped layers 2302, 2102 and 1404 exposed at the bottom of the contact trenches 2702, 2704 and 2706, respectively. As provided above, the doped layers 2302 and 2102/1404 can be formed from materials such as BSG or PSG (depending on whether a p-type or an n-type dopant source is needed). Both BSG and PSG are essentially silicon oxide materials doped with boron or phosphorous. In that case, an oxide-selective etch can be used remove the BSG or PSG, while leaving the sidewall liner 2802 intact.

Namely, an isotropic (non-directional) etching process such as an oxide-selective wet chemical etch or a gas phase etch is then used to selectively remove the doped layers 2302 and 2102/1404 from the top and bottom VTFETs through the contact trenches 2702, 2704 and 2706, respectively, forming cavities 2902/2904 and 2906 alongside the upper/lower second sacrificial layers 802a of the isolation structure 1302b in the top VTFETs along fin 202, and alongside the upper second sacrificial layer 802a of the isolation structure 1302c in the bottom VTFET along fin 204. See FIG. 29A (an X-X' cross-sectional view) and FIG. 29B (a Y-Y' cross-sectional view).

The upper/lower second sacrificial layers 802a of the isolation structure 1302b in the top VTFETs along fin 202, and the upper second sacrificial layer 802a of the isolation structure 1302c in the bottom VTFET along fin 204 are then selectively removed through the contact trenches 2702/2704 and cavities 2902/2904, and through the contact trench 2706 and cavity 2906, respectively, forming an aperture 3002 below the bottom source/drain region 2508 of the top VTFET along fin 202, aperture 3004 above the top source/drain region 2506 of the bottom VTFET along fin 202, and aperture 3006 below the bottom source/drain region 2504 of the bottom VTFET along fin 204. See FIG. 30A (an X-X' cross-sectional view) and FIG. 30B (a Y-Y' cross-sectional view). As provided above, the sacrificial layer 802 can be formed from SiGe having a high Ge content. In that case, an etchant such as dry HCl can be employed to selectively remove these second sacrificial layers 802a. The upper and/or lower second sacrificial layers 802a that have been removed are then replaced with a contact metal(s) to form the present source/drain contacts.

Namely, a contact metal (or combination of contact metals) is/are then deposited into, and filling, contact trench 2702/cavity 2902/aperture 3002, contact trench 2704/cavity 2904/aperture 3004, and contact trench 2706/cavity 2906/aperture 3006 to form source/drain contacts 3102, 3104 and 3106 to the bottom source/drain region 2508 of the top VTFET along fin 202, the top source/drain region 2506 of the bottom VTFET along fin 202 and the bottom source/drain region 2504 of the bottom VTFET along fin 204, respectively. See FIG. 31A (an X-X' cross-sectional view) and FIG. 31B (a Y-Y' cross-sectional view). Suitable contact metals include, but are not limited to, titanium (Ti), copper (Cu), nickel (Ni), platinum (Pt) and/or tungsten (W), which can be deposited using a conformal deposition process such as ALD. Excess contact metal can be removed using a process such as CMP.

Finally, source/drain contacts 3202 and 3204, and a gate contact 3206 are formed to the top source/drain regions 2510 of the top VTFETs along fin 202 and fin 204, and to the gate stacks 1902b and 2410b of the top and bottom VTFET along fin 204. See FIG. 32A (an X-X' cross-sectional view) and FIG. 32B (a Y-Y' cross-sectional view). Although not visible in the views shown, a gate contact to the gate stacks 1902a and 2410a of the top and bottom VTFET along fin 202 can be configured in the same manner. Since these structures can be accessed from the top-down, the process for forming source/drain contacts 3202/3204 and gate contact 3206 is straightforward and can be performed using standard metallization techniques. As above, suitable contact metals for the source/drain contacts 3202 and 3204 and gate contact 3206 include, but are not limited to, Ti, Cu, Ni, Pt and/or W.

Figure 32A:
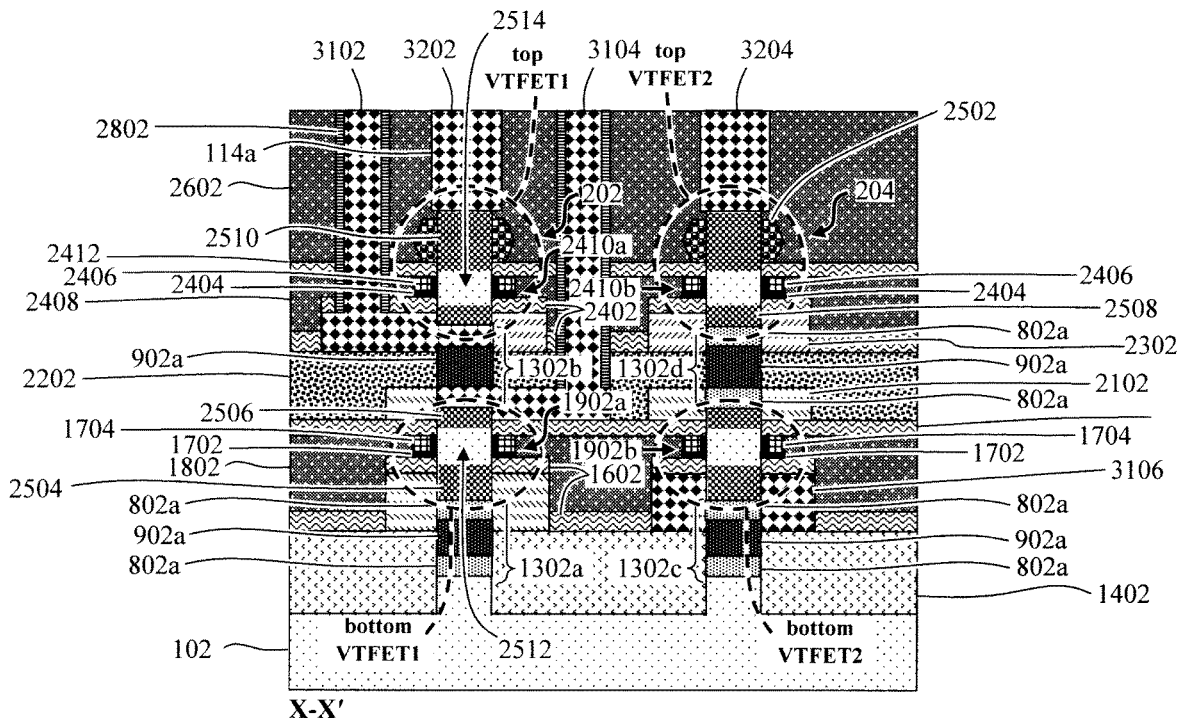
FIG. 32A is an X-X' cross-sectional view illustrating source/drain contacts, and a gate contact having been formed to the top source/drain regions of the top VTFETs along the first/second fins, and to the gate stacks of the top and bottom VTFET along the second fin.
Figure 32B:
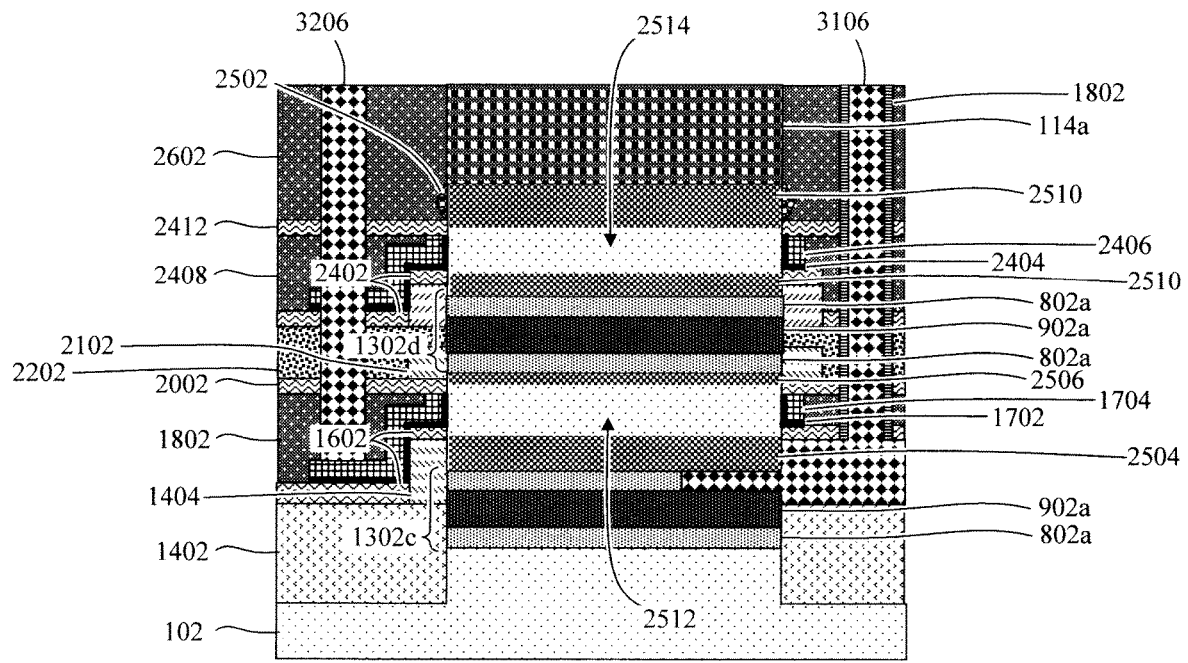
FIG. 32B is a Y-Y' cross-sectional view illustrating the source/drain contacts, and the gate contact having been formed to the top source/drain regions of the top VTFETs along the first/second fins, and to the gate stacks of the top and bottom VTFET along the second fin according to an embodiment of the present invention.

Dashed lines are used in FIG. 32A to highlight the relative orientation of the individual bottom VTFETs (i.e., bottom VTFET1 and bottom VTFET2) and top VTFETs (i.e., top VTFET1 and top VTFET2) in the present stacked VTFET device structure. With this configuration, the wherein the vertical fin channels 2512 of the bottom VTFET1 and bottom VTFET2 are aligned vertically with the vertical fin channels and 2514 of the top VTFET1 and top VTFET2, respectively. As shown in FIG. 32A, isolation layer 902a separates each of the bottom VTFETs (i.e., bottom VTFET1 and bottom VTFET2) from the corresponding top VTFETs (i.e., top VTFET1 and top VTFET2). In general, an isolation layer 902a is present in between the vertical fin channels 2512 of the bottom VTFETs and the vertical fin channels 2514 of the top VTFETs. However, in the instant example, an isolation layer 902a is present between, and in direct contact with the source/drain contacts 3102 and 3104.

Figure 33:
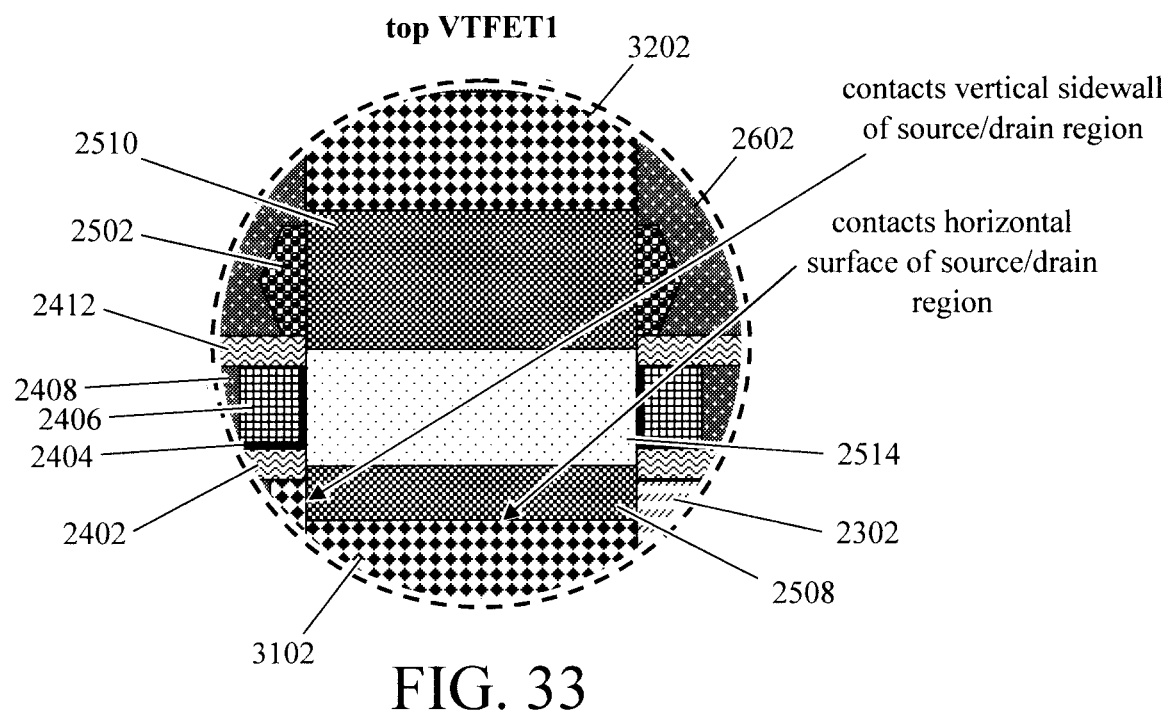
FIG. 33 is a magnified view of the top VTFET along the first fin illustrating the present source/drain contact design for increased contact area and decreased resistance according to an embodiment of the present invention.

Further, as provided above, the present stacked VTFET device structure advantageously employs source/drain contacts that wrap-around the corner of the source/drain regions from a vertical sidewall to an adjacent horizontal surface for increased contact area and decreased resistance. For illustrative purposes only, a magnified view of the top VTFET1 is provided in FIG. 33 to further illustrate this notable feature of the present stacked VTFET device structure. For instance, as shown in FIG. 33, the bottom source/drain region 2508 of the top VTFET1 would be inaccessible from the top-down. However, the source/drain contact 3102 formed in accordance with the above-described process is in direct contact with more than one surface of the bottom source/drain region 2508 of the top VTFET1. Namely, as shown in FIG. 33, source/drain contact 3102 directly contacts both a vertical surface along a sidewall and an adjacent horizontal surface (in this case a bottom surface) of the bottom source/drain region 2508 of the top VTFET1. In the instant example, source/drain contacts 3104 and 3106 have the same design where they directly contact both a vertical surface along a sidewall and an adjacent horizontal surface (in this case a top surface) of the top source/drain region 2506 of the bottom VTFET1 and both a vertical surface along a sidewall and an adjacent horizontal surface (in this case a bottom surface) of the bottom source/drain region 2504 of the bottom VTFET2, respectively.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A stacked vertical transport field-effect transistor (VTFET) device, comprising:
   at least a bottom VTFET below a top VTFET, wherein the bottom VTFET and the top VTFET each comprises two source/drain regions each vertically connected to a vertical fin channel, and a gate stack alongside the vertical fin channel; and
   a first source/drain contact directly contacting a vertical sidewall and a horizontal bottom surface of a bottom source/drain region of the top VTFET.

2. The stacked VTFET device of claim 1, wherein the vertical fin channel of the bottom VTFET is aligned vertically with the vertical fin channel of the top VTFET.

3. The stacked VTFET device of claim 1, further comprising:
   an isolation layer in between the vertical fin channel of the bottom VTFET and the vertical fin channel of the top VTFET.

4. The stacked VTFET device of claim 3, wherein the isolation layer comprises a material selected from the group consisting of: silicon nitride (SiN), silicon oxynitride (SiON), silicon carbide nitride (SiCN), and combinations thereof.

5. The stacked VTFET device of claim 3, further comprising an isolation structure in between the vertical fin channel of the bottom VTFET and the vertical fin channel of the top VTFET, wherein the isolation structure comprises the isolation layer between an upper sacrificial layer and a lower sacrificial layer.

6. The stacked VTFET device of claim 5, wherein the sacrificial layer comprises silicon germanium (SiGe) having from about 50% germanium (Ge) to about 100% Ge.

7. The stacked VTFET device of claim 5, wherein the sacrificial layer comprises SiGe65.

8. The stacked VTFET device of claim 3, wherein the isolation layer is adjacent to the first source/drain contact.

9. The stacked VTFET device of claim 1, further comprising:
   a doped layer adjacent to at least one of the source/drain regions.

10. The stacked VTFET device of claim 9, wherein the doped layer comprises an n-type dopant or a p-type dopant.

11. The stacked VTFET device of claim 9, wherein the doped layer comprises a material selected from the group consisting of: phosphorous-doped glass (PSG) and boron-doped glass (BSG).

12. The stacked VTFET device of claim 1, further comprising a second source/drain contact contacting the vertical sidewall and a horizontal top surface of a top source/drain region of the bottom VTFET.

13. The stacked VTFET device of claim 1, further comprising a second source/drain contact contacting the vertical sidewall and a horizontal top surface of a top source/drain region of the bottom VTFET.

14. The stacked VTFET device of claim 1, wherein the top VTFET is a PFET and the bottom VTFET is an NFET.

15. A semiconductor device, comprising:
   at least a first bottom vertical transport field effect transistor (VTFET) (bottom VTFET1) below a first top VTFET (top VTFET1), and a second bottom VTFET (bottom VTFET2) below a second top VTFET (top VTFET2), wherein the bottom VTFET1, the top VTFET1, the bottom VTFET2 and the top VTFET2 each comprises at least a gate stack alongside a vertical fin channel and a first source/drain region directly above and a second source/drain region directly below the vertical fin channel;
   a first source/drain contact in direct contact with a vertical sidewall and a horizontal bottom surface of the first source/drain region in the top VTFET1; and
   a second source/drain contact in direct contact with a vertical sidewall and a horizontal bottom surface of the second source/drain region in the bottom VTFET2.

16. The semiconductor device of claim 15, further comprising:
   an isolation layer in between the first source/drain contact and the second source/drain contact, wherein the isolation layer comprises a material selected from the group consisting of: SiN, SiON, SiCN, and combinations thereof.

17. The semiconductor device of claim 15, further comprising an isolation structure in between the vertical fin channel of the bottom VTFET2 and the vertical fin channel of the top VTFET2, and bottom VTFET and the vertical fin channel of the top VTFET, wherein the isolation structure comprises an isolation layer between an upper sacrificial layer and a lower sacrificial layer.

18. The semiconductor VTFET device of claim 17, wherein the isolation layer comprises a material selected from the group consisting of: SiN, SiON, SiCN, and combinations thereof, and wherein the upper sacrificial layer and the lower sacrificial layer each comprises silicon germanium (SiGe) having from about 50% germanium (Ge) to about 100% Ge.

19. The stacked VTFET device of claim 15, further comprising a third source/drain contact in direct contact with the vertical sidewall and a horizontal top surface of the second source/drain region in the bottom VTFET1.

20. The stacked VTFET device of claim 15, wherein the top VTFET1 is a PFET and the bottom VTFET1 is an NFET.

* * * * *